(12) United States Patent
Ikata et al.

(10) Patent No.: US 6,380,823 B1
(45) Date of Patent: Apr. 30, 2002

(54) ANTENNA DUPLEXER WITH RECEIVING, TRANSMITTING, AND ANTENNA TERMINAL GROUPS SEPARATED PLANARLY

(75) Inventors: Osamu Ikata; Yoshio Satoh; Takashi Matsuda; Tokihiro Nishihara, all of Kawasaki (JP)

(73) Assignees: Fujitsu Limited, Kawasaki; Fujitsu Media Devices Limited, Suzaka, both of (JP)

( * ) Notice: Subject to any disclaimer, the term of this patent is extended or adjusted under 35 U.S.C. 154(b) by 0 days.

(21) Appl. No.: 09/560,968

(22) Filed: Apr. 28, 2000

(30) Foreign Application Priority Data

Jun. 4, 1999  (JP) ............................................ 11-158327

(51) Int. Cl.[7] .............................. H03H 9/72; H03H 9/64
(52) U.S. Cl. ........................................ 333/133; 333/193
(58) Field of Search .......................... 333/133, 193–196

(56) References Cited

U.S. PATENT DOCUMENTS

| 5,561,406 A | * | 10/1996 | Ikata et al. ............. 333/133 X |
| 5,815,052 A | * | 9/1998 | Nakajima et al. ........ 333/176 X |
| 5,864,260 A | * | 1/1999 | Lee ........................... 333/133 |
| 5,874,869 A | * | 2/1999 | Ueda et al. ................. 333/193 |
| 6,023,204 A | * | 2/2000 | Ikata et al. ................. 333/193 |
| 6,043,725 A | * | 3/2000 | Taguchi et al. ............. 333/193 |
| 6,115,592 A | * | 9/2000 | Ueda et al. ................. 455/307 |

FOREIGN PATENT DOCUMENTS

| EP | 1014592 A2 | * | 6/2000 |
| JP | 9-51206 |  | 2/1997 |
| JP | 9-121138 | * | 5/1997 |
| JP | 10-126213 |  | 5/1998 |
| JP | 2000-188522 | * | 7/2000 |

\* cited by examiner

*Primary Examiner*—Benny Lee
*Assistant Examiner*—Barbara Summons
(74) *Attorney, Agent, or Firm*—Armstrong, Westerman & Hattori, LLP

(57) ABSTRACT

An antenna duplexer including two duplexer elements each including two surface acoustic wave filters having different center pass band frequencies and connecting terminals for connecting the duplexer elements and external circuits, which are grouped into an antenna terminal group for connection to an external antenna, a receiving terminal group for connection to an external circuit and a transmitting terminal group for connection to an external circuit, wherein regions for disposing the antenna terminal group, the receiving terminal group and the transmitting terminal group are separated planarly.

11 Claims, 32 Drawing Sheets

FIG.5
(a)
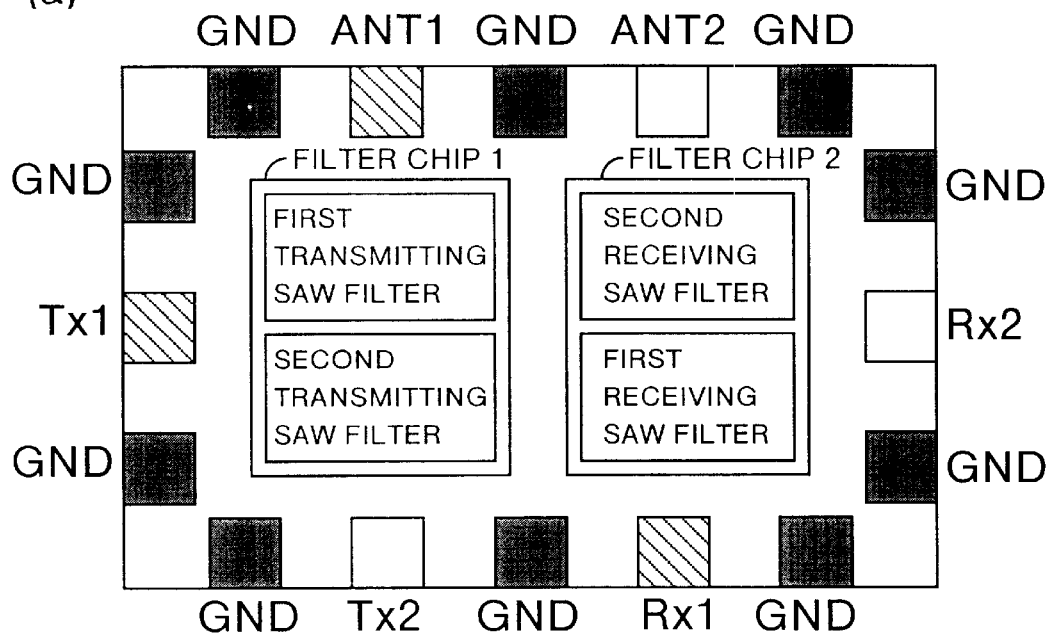
(b)
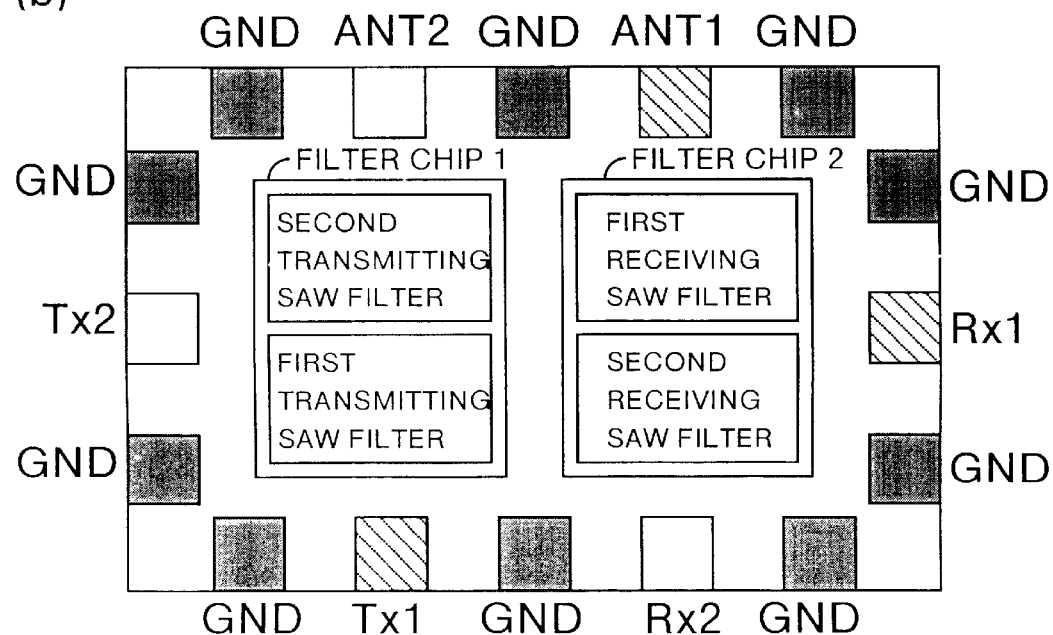

FIG.8
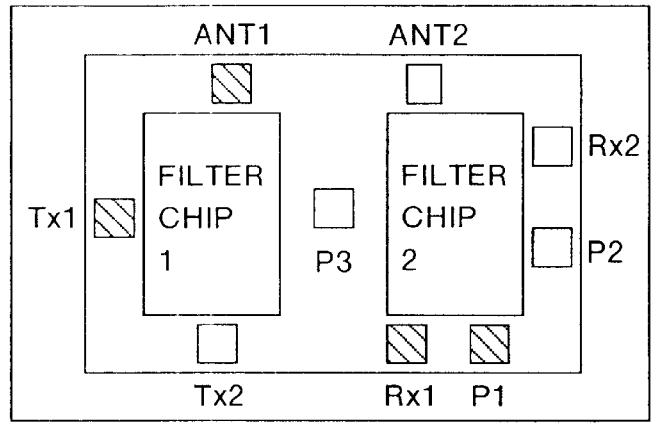
(a) ARRANGEMENT OF TERMINALS OF PACKAGE
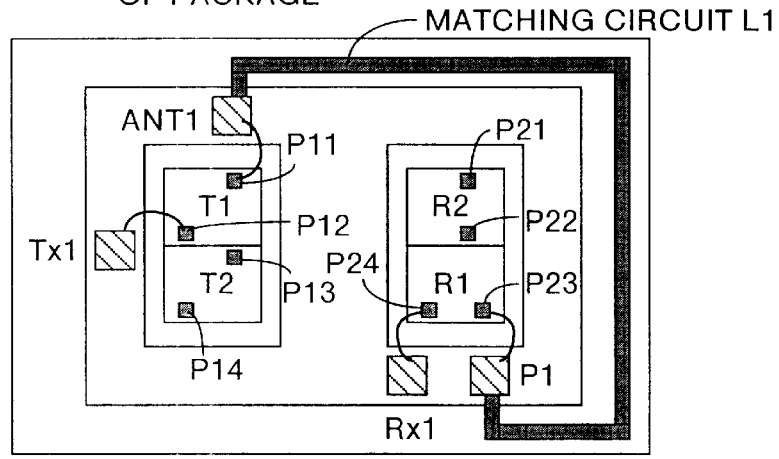
(b) CONNECTION OF GROUP 1 TERMINALS
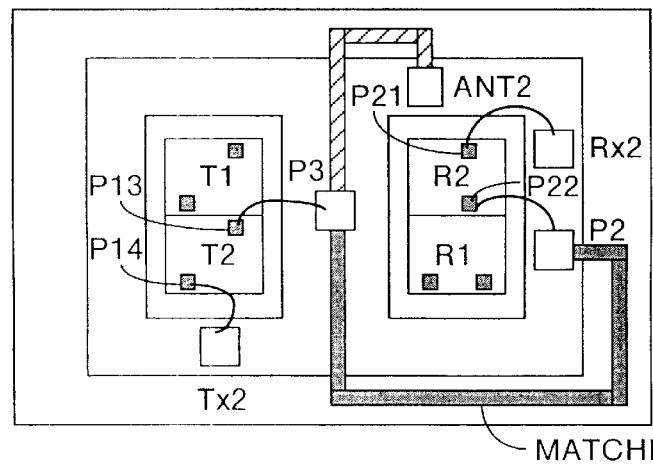
(c) CONNECTION OF GROUP 2 TERMINALS

FIG.9
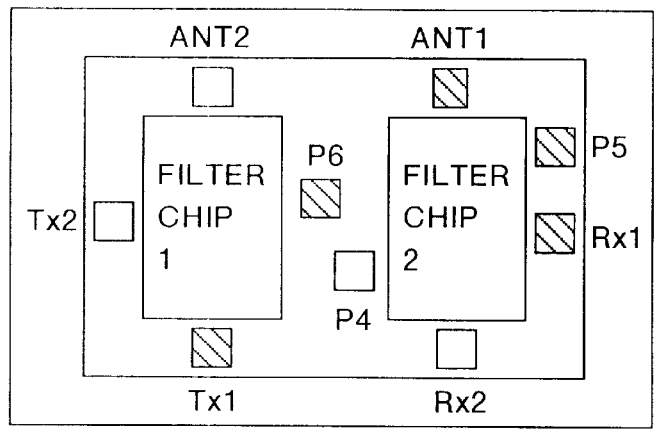
(a) ARRANGEMENT OF TERMINALS OF PACKAGE
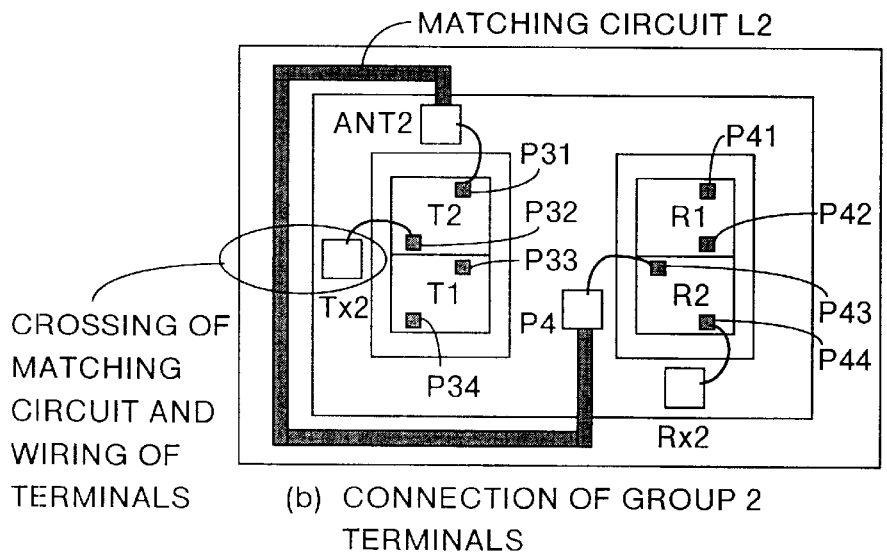
(b) CONNECTION OF GROUP 2 TERMINALS
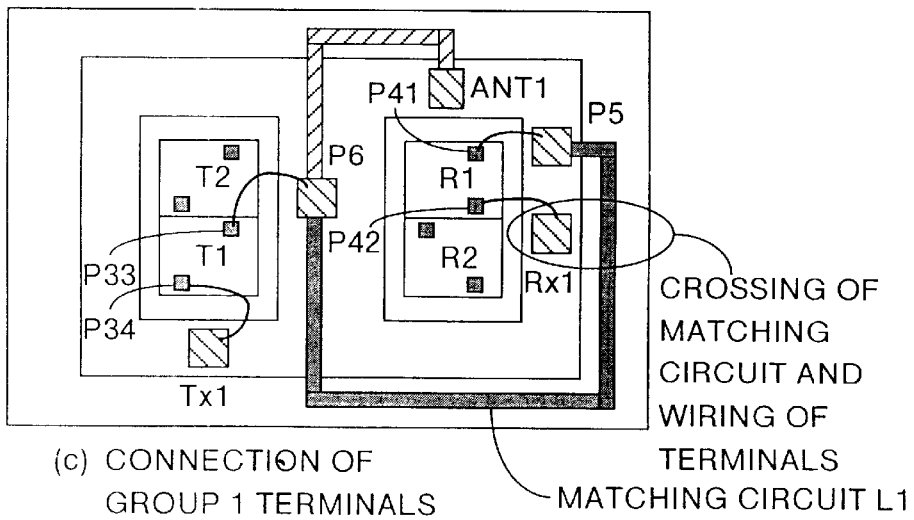
(c) CONNECTION OF GROUP 1 TERMINALS FIG.11
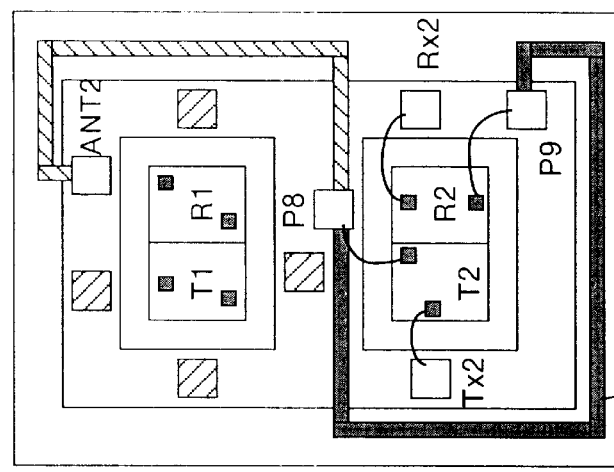
(c) CONNECTION OF GROUP 2 TERMINALS
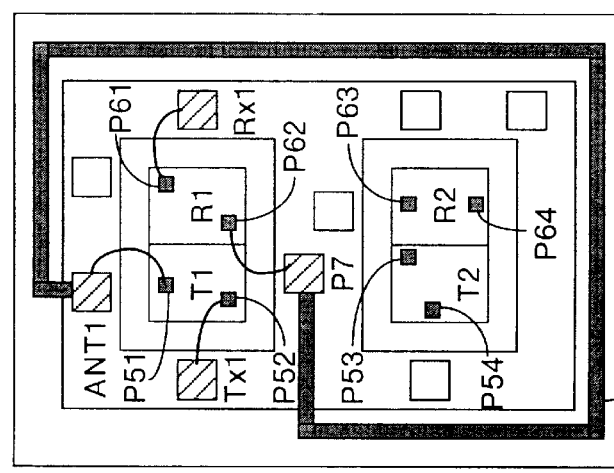
(b) CONNECTION OF GROUP 1 TERMINALS
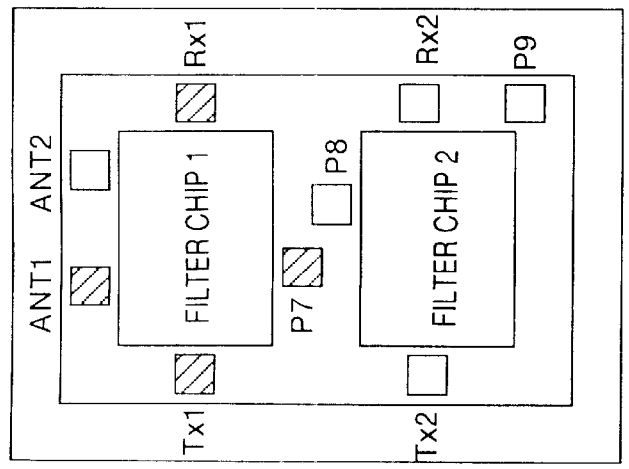
(a) ARRANGEMENT OF TERMINALS OF PACKAGE

ANTENNA DUPLEXER WITH RECEIVING, TRANSMITTING, AND ANTENNA TERMINAL GROUPS SEPARATED PLANARLY

CROSS-REFERENCE TO RELATED APPLICATION

This application is related to Japanese Patent Appplication No. HEI 11(1999)-158327 filed on Jun. 4, 1999, whose priority is claimed under 35 USC §119, the disclosure of which is incorporated by reference in its entirety.

BACKGROUND OF THE INVENTION

1. Field of the Invention

The present invention relates to an antenna duplexer and, more particularly, to an antenna duplexer constructed of a combination of antenna duplexers which include surface acoustic wave (SAW) filters used for mobile communication devices.

2. Description of the Related Art

With recent development of mobile communication systems, mobile phones, portable communication terminals and other mobile communication devices have been rapidly coming into widespread use. Because these devices are desired to be smaller in size and more powerful in performance, components used in these devices are also required to be reduced in size and improved in performance.

As regards mobile phones, two kinds of radio communication systems, i.e., digital and analog, are employed, and a diversity of frequencies in a 800 MHz to 1 GHz band and a 1.5 GHz to 2.0 GHz band are used for radio communications.

In mobile communication devices, antenna duplexers are used as components in RF sections which branch and generate signals transmitted and received through antennae.

FIG. 30 is a block diagram illustrating the construction of a high frequency part of a conventionally used mobile phone.

Audio signals 100 input from a microphone are modulated into modulated signals by a modulator 101 according to a modulation system of the mobile phone, and further converted to a designated carrier frequency by a local oscillator 108. Thereafter the converted audio signals pass through an interstage filter 102 for selecting signals of the designated transmitting frequency alone, are amplified to a desired signal amplitude by a power amplifier 103 and sent to an antenna duplexer 105. The antenna duplexer sends signals of the designated transmitting frequency alone to an antenna 104, from which the signals are transmitted into the air as radio signals.

On the other hand, signals received by the antenna 104 are sent to the antenna duplexer 105, where only signals of a designated frequency are selected. The selected signals are amplified by a low-noise amplifier 106 and passed through an interstage filter 107. Only speech signals are selected by an IF filter and taken out as audio signals 100 by a demodulator 111. The antenna duplexer 105 is located between the antenna 104 and what is called an audio signal processing circuit, and has the functions of distributing transmitted and received signals and avoiding their interference.

Further, for responding to diversification of radio communication systems, dual-mode and dual-band techniques are employed for imparting higher-levels of functions to mobile phones.

The dual-mode technique means, for example, a technique for providing a single mobile phone with analog/digital compatibility or TDMA (time-division multiplexing access)/CDMA (code-division multiplexing access) compatibility in digital communications.

The dual-band technique means a technique for providing a single mobile phone with access to two bands, for example, 800 MHz band and 1.9 GHz band, or 900 MHz band and 1.8 GHz band (or 1.5 GHz band).

For supporting such high-levels of functions of mobile phones, it is demanded that filters used for mobile phones also have a dual-port or dual-band function (hereinafter the phase "have a dual function" is used for indicating having either function). As filters having a dual function, filters having two inputs and two outputs and filters having one input and two outputs have been developed. As regards the one-input two-output filters, a phase matching circuits is usually added outside the filters because terminals on a commonized side must be gathered together.

In the case of filters used between stages in the RF section for branching and generating signals from/to the antenna, an IF section and other sections (so-called interstage filters), combinations of transmitting filters alone and combinations of receiving filters alone are put to practical use as dual-function filters.

For providing the dual-band access to antenna duplexers, antenna duplexers have been developed which uses dielectric duplexers for branching and generating signals of least one pass band.

FIG. 27 shows the construction of a dual-function antenna duplexer D3 which is composed of a duplexer D1 for branching and generating signals of a higher pass band frequency and a duplexer D2 for branching and generating signals of a lower pass band frequency.

Here, PA denotes a power amplifier, LNA denotes a low-noise amplifier, and SW1, SW2 and SW3 denote circuit changing switches. The duplexers D1 and D2 are each composed of a transmitting filter (T1 or T2), a receiving filter (R1 or R2) and a phase matching circuit (L1 or L2).

In the North American PCS system and the European DCS1800 system which require a narrow frequency band gap (or transition band) between transmitting and receiving pass band frequencies, if dielectric duplexers are used, the size of the duplexers themselves becomes as large as about 2.8 cm×0.9 cm×0.5 cm, which prevents reduction in size and in thickness of portable terminal devices.

Also antenna duplexers have been developed in which SAW filters are used for the transmitting filters (T1, T2) and the receiving filters (R1, R2) shown in FIG. 27.

As such duplexers constructed with use of SAW filters, proposed are module-type duplexers in which two SAW filters and matching circuits are packaged on printed circuit boards and one-piece duplexers in which two SAW filters of a bare type are mounted in multi-layered ceramic packages and matching circuits are mounted within the packages. Such SAW filters can be reduced in size and thickness to a volume of about one-third to about one-fifth of that of dielectric filters and to a thickness of about half to about one-third of that of the dielectric filters.

In FIG. 27, one duplexer D1 has three terminals ANT1, Tx1, Rx1 and grounding terminals, not shown. These terminals and external terminals (SW1, SW2, SW3, PA, etc.) are connected to a filter chip via terminals provided to the package by wire bonding or the like.

One duplexer as shown in FIG. 27 is a so-called three-port device having three terminals ANT1, Tx1 and Rx1. In the antenna duplexer D3 having two of such duplexers in combination, it is difficult to construct circuits so as to separate a transmitting circuit (Tx1, Tx2, SW2 and PA), a receiving circuit (Rx1, Rx2, SW3, LNA) and an antenna circuit (SW1, ANT2, ANT2) from the viewpoint of connection to external circuits.

In other words, an inappropriate arrangement of the connecting terminals such as Tx1, Rx1 and the like may lead to crossing of connecting wires, which results in interference of signals and/or generation of noises. Consequently, desired filter characteristics may not be obtained.

A well-designed wiring on printed circuit boards for mounting filter chips may enable the separation of the above-mentioned three circuits to some extent. However, at the stage of designing circuit boards, it is extremely difficult to decide patterns and layouts for the circuits with considering interference between signals and required specifications of a small-sized dual-function antenna duplexer.

Therefore, for responding to demand for dual function and size reduction, it is necessary to contrive a clever arrangement of connecting terminals on the package of the antenna duplexer D3 containing the two duplexers D1 and D2.

As regards SAW filters used for the transmitting filter T1 and the receiving filter R1 of the duplexer, in general, size reduction is considered to be possible if an increased number of filter chips are mounted in one filter package or if an increased number of SAW filters are formed on one filter chip.

However, even if a large number of SAW filters are formed on each of filter chips which are then made into two pairs of transmitting filters and receiving filters, further idea is still necessary for avoiding interference between the filter characteristics of the transmitting filters and the receiving filters when an antenna duplexer is constructed of the filters. For this purpose, a phase matching circuit is required to be installed, and further the arrangement of the terminals of the filters needs to be decided in consideration of their connection relation to connecting terminals on the printed circuit board. In this case, the designing of circuits is also significantly difficult.

Generally speaking, the arrangement of terminals of printed circuit boards for mounting antenna duplexers is pre-determined in many cases. Accordingly, the designing of the circuits of an antenna duplexer depends greatly on the pre-determined arrangement of terminals on a printed circuit board. That is, in the designing of the circuits of the antenna duplexer, the layout of the terminals of filter chips and the phase matching circuit must be designed taking into account the prevention of interference between signals and the pre-determined arrangement of the terminals on the printed circuit board.

Especially, the recent demand for reduction in size of terminal devices also requires duplexer packages to be smaller. In the duplexer packages, strip lines used as phase matching circuits, wires between signal terminals and wires to external circuits need to be arranged not to cross each other, or if they are required to cross each other for a desired size reduction, the duplexer packages should be constructed such that interference between signals is prevented in wire-crossing regions.

In one-piece duplexer packages in which phase matching circuits are mounted within the duplexer packages for reducing the size thereof, parasitic inductance is generated between layers, which is known to cause decline in attenuation outside a pass band.

FIGS. 28(a), 28(b) and 28(c) are graphical representations of frequency characteristics of SAW filters with changes of a parasitic inductance (L) in an antenna duplexer.

According to these graphical representations, the larger the parasitic inductance (L) is, the less the attenuation outside pass bands is.

Generally, when the phase matching circuit is integrated within a package, necessary circuits can be formed in a multi-layered structure, which lead to size reduction. However, this multi-layered structure causes an increase in the parasitic inductance. Accordingly, it is necessary to decrease the height of the duplexer package for improving the attenuation outside the pass band.

Further, if the distance between the strip line and signal terminals is decreased for size reducing of the duplexer package, capacity coupling tends to increase therebetween. This results in decline in the attenuation outside the pass band which is one of frequency characteristics. Accordingly, it is desired that the circuits are designed in consideration of the capacity coupling besides the decrease of the height of the duplexer package.

Also, in the case where two duplexers greatly different in their pass band frequencies are made into a single antenna duplexer, external circuits connected to the duplexers must be separately provided. On the other hand, in the case where two duplexers slightly different in their pass band frequencies are made into a single antenna duplexer, the construction of the antenna duplexer may be such that circuits are partially shared and switched by use of RF switches or the like for size reducing purpose. However, it is desirable that the number of RF switches be as small as possible from the viewpoint of desired size reduction and improvement of frequency characteristics.

Further, in the case where two duplexers greatly different in their pass band frequencies are made into a single antenna duplexer, SAW filters for composing the respective duplexers are produced under considerably different conditions and matching circuits added thereto have patterned lines of greatly different lengths. Accordingly, such differences must be taken into careful consideration when the layout of the duplexer package is designed.

FIG. 29 is a graphical representation showing a relationship between the velocity V of a surface acoustic wave (SAW) passing a SAW filter and a normalized thickness $h/\lambda$ of electrodes. Here, h represents the thickness of the electrodes and $\lambda$ represents the period of the electrodes. Generally the relationship of the center pass band frequency $f_0$ of a filter, the SAW velocity V and the period $\lambda$ is represented by $f_0=V/\lambda$. Accordingly, a desired $f_0$ is obtained by optimizing V and $\lambda$. For example, as shown in FIG. 29, the normalized thickness $h/\lambda$ needs to be larger for reducing the SAW velocity V. However, there is a problem in that V changes greatly with respect to a change in h, and therefore, $f_0$ becomes unstable.

In other words, in the case where two duplexers whose pass band frequencies are so different that the SAW velocities in the duplexers are significantly different are formed in a single package, comb-shaped electrodes of the SAW filters in the respective duplexers are greatly different in thickness, period and width. Therefore, it is also necessary to vary exposure conditions, etching conditions and other conditions in production of the SAW filters.

SUMMARY OF THE INVENTION

The present invention provides an antenna duplexer including two duplexer elements each including two surface acoustic wave filters having different center pass band frequencies; and connecting terminals for connecting the duplexer elements and external circuits, which are grouped into an antenna terminal group for connection to an external antenna, a receiving terminal group for connection to an external circuit and a transmitting terminal group for connection to an external circuit, wherein regions for disposing the antenna terminal group, the receiving terminal group and the transmitting terminal group are separated planarly.

With this construction, the antenna duplexer can be reduced in size with maintaining its required filter characteristics.

BRIEF DESCRIPTION OF THE DRAWINGS

FIGS. 5(a) and 5(b) show examples of arrangement of connecting terminals in a package of an antenna duplexer in accordance with the present invention;

FIGS. 8(a) to 8(c) are diagrams illustrating an example of wiring connection of connecting terminals in a package of an antenna duplexer in accordance with the present invention;

FIGS. 9(a) to 9(c) are diagrams illustrating an example of wiring connection of connecting terminals in a package of an antenna duplexer in accordance with the present invention;

FIGS. 11(a) to 11(c) are diagrams illustrating an example of wiring connection of connecting terminals in an antenna duplexer package corresponding to the arrangement of connecting terminals shown in FIG. 6;

DESCRIPTION OF THE PREFERRED EMBODIMENTS

Figure 1:
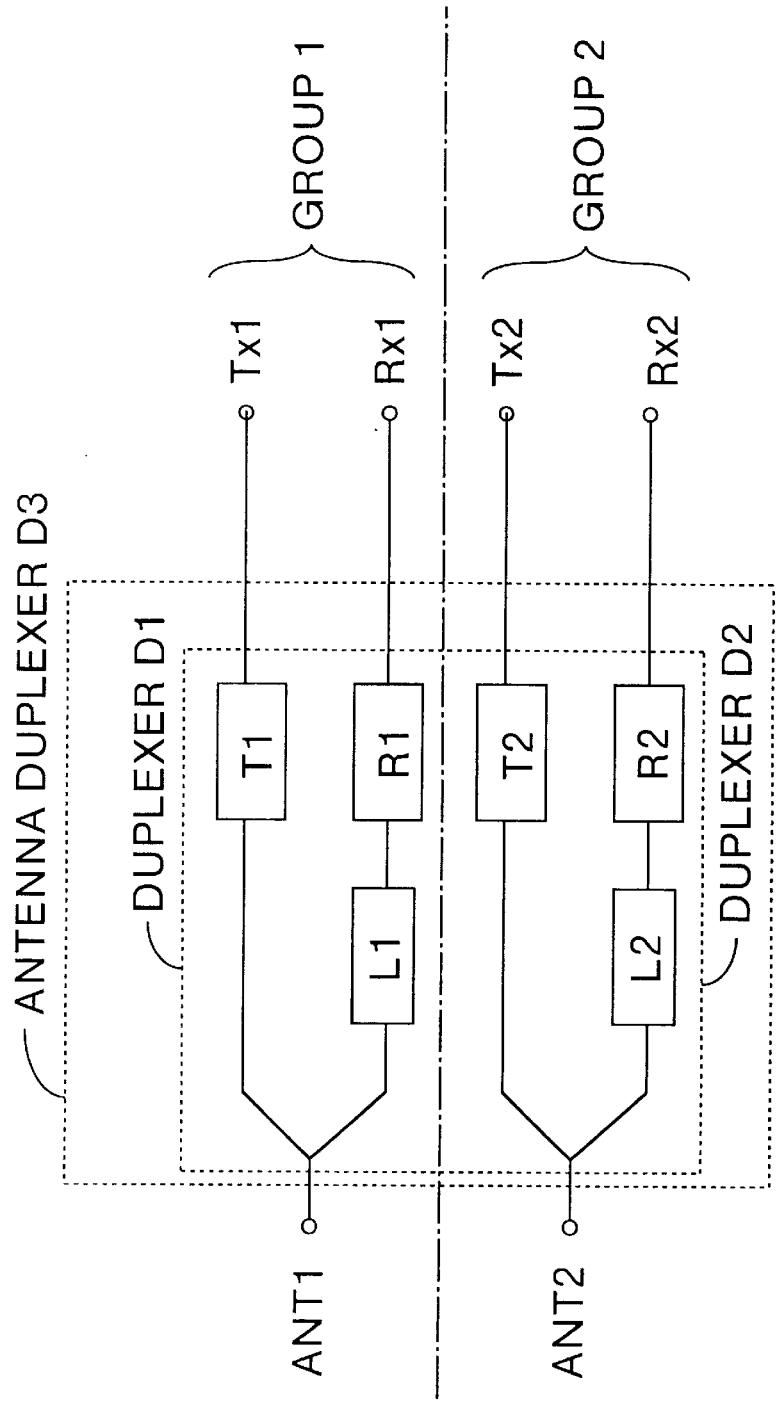
FIG. 1 is a diagram illustrating a fundamental construction of an antenna duplexer in accordance with the present invention.

In view of the above-described circumstances, an object of the present invention is to put inventive ideas into the arrangement of terminals of a package and the like in an antenna duplexer using SAW filters for reducing the size of the antenna duplexers with maintaining required filter characteristics.

The present invention also provides an antenna duplexer wherein the duplexer elements are comprised of a first duplexer element including two transmitting surface acoustic wave filters and a second duplexer element including two receiving surface acoustic wave filters, the transmitting terminal group is disposed near the first duplexer element, and the receiving terminal group is disposed near the second duplexer element.

Further the present invention provides an antenna duplexer wherein a first duplexer is comprised of a first transmitting surface acoustic waver filter of the first duplexer element and a first receiving surface acoustic wave filter of the second duplexer element, a second duplexer is comprised of a second transmitting surface acoustic waver filter of the first duplexer element and a second receiving surface acoustic wave filter of the second duplexer element, and the first and second transmitting and receiving surface acoustic wave filters are so disposed that a line connecting the first transmitting surface acoustic wave filter and the first receiving surface acoustic filter crosses a line connecting the second transmitting surface acoustic wave filter and the second receiving surface acoustic filter.

Still further the present invention provides an antenna duplexer wherein the duplexer elements are comprised of a first duplexer element including a first transmitting surface acoustic waver filter and a first receiving surface acoustic wave filter and a second duplexer element including a second transmitting surface acoustic waver filter and a second receiving surface acoustic wave filters, the first and second transmitting surface acoustic wave filters are disposed near the transmitting terminal group, and the first and second receiving surface acoustic wave filters are disposed near the receiving terminal group.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

In this invention, the antenna duplexer means an electronic device in which two duplexers constructed with use of surface acoustic wave (SAW) filters are accommodated in a package.

In general, one duplexer is composed of one transmitting SAW filter (transmitting filter) and one receiving SAW filter (receiving filter).

However, according to the present invention, one duplexer is comprised of two SAW filters which may be two transmitting SAW filters or two receiving SAW filters as well as one transmitting SAW filter and one receiving SAW filter.

The external circuits include an antenna and signal processing circuits such as a circuit for converting audio signals to electric signals, a circuit for modulation to high-frequency signals, an amplifying circuit and the like.

The connecting terminals are terminals provided for the antenna duplexer, including terminals mounted on the duplexers, terminals mounted on the external circuits and terminals connected by wires.

Such connecting terminals are disposed in a great number on the surface of the package which is a part of the antenna duplexer. The connecting terminals are formed of a metal material such as Au-plated copper.

Usually, the outline of the package is polygonal, especially rectangular, in a lot of cases. The connecting terminals are mounted in inside vicinities of peripheral sides of the polygonal package.

The package of the antenna duplexer is formed of a multi-layered insulator, in which a ground pattern and a matching circuit pattern in strip lines are inserted between layers. These ground pattern, matching circuit and connecting terminals are connected by through holes extending through the layers, by castellation or by both.

On the other hand, the SAW filters for composing the duplexers are each formed of a plurality of SAW resonators each of which is comprised of comb-shaped electrodes formed on a piezoelectric substrate.

FIG. 1 shows a fundamental construction of an antenna duplexer D3 in accordance with the present invention.

The antenna duplexer D3 is comprised of two duplexers D1 and D2 formed in a single package. Each of the duplexers D1 and D2 is comprised of two SAW filters, that is, a transmitting filter (T1 or T2) and a receiving filter (R1 or R2), and a matching circuit (L1 or L2).

Here, the duplexers D1 and D2 have connecting terminals for connection to external circuits. The connecting terminals include a group of antenna terminals (ANT1 and ANT2) which are connected to an antenna and are common to the transmitting and receiving filters, a first group of transmitting and receiving terminals (Tx1 and Rx1), a second group of transmitting and receiving terminals (Tx2 and Rx2), and grounding terminals (GND), not shown.

Figure 20:
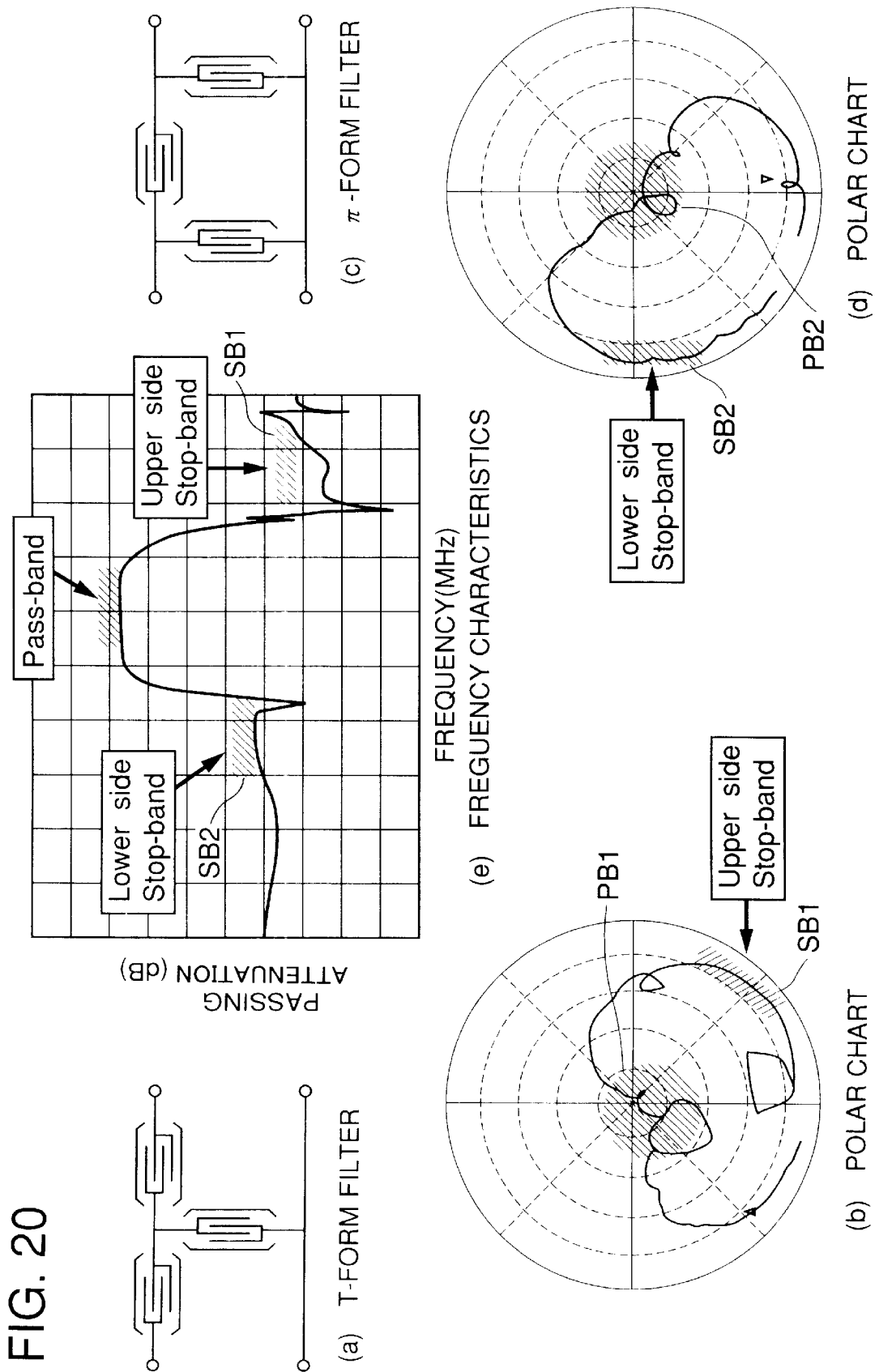
FIGS. 20(a) to 20(e) shows characteristics of ladder-formed SAW filters for comparison.

The matching circuit is provided between the antenna terminal group and a SAW filter. In FIG. 1, the matching circuit is provided between the antenna terminal group and the receiving filter, but the position of the matching circuit is not limited thereto. For example, if the filers of the duplexer basically have a ladder configuration of T type and π type as shown in FIG. 20, the matching circuit can be provided to either one of the transmitting and receiving SAW filters of the duplexer that has a higher center pass band frequency. Therefore, so long as this condition is satisfied, the matching circuit may be provided between the antenna terminal group and the transmitting filter.

The present invention has major features in the arrangement of three signal terminal groups (ANT, Tx and Rx), the arrangement of four SAW filters (T1, T2, R1 and R2) in the antenna duplexer D3 having a fundamental construction as described above.

Figure 2:
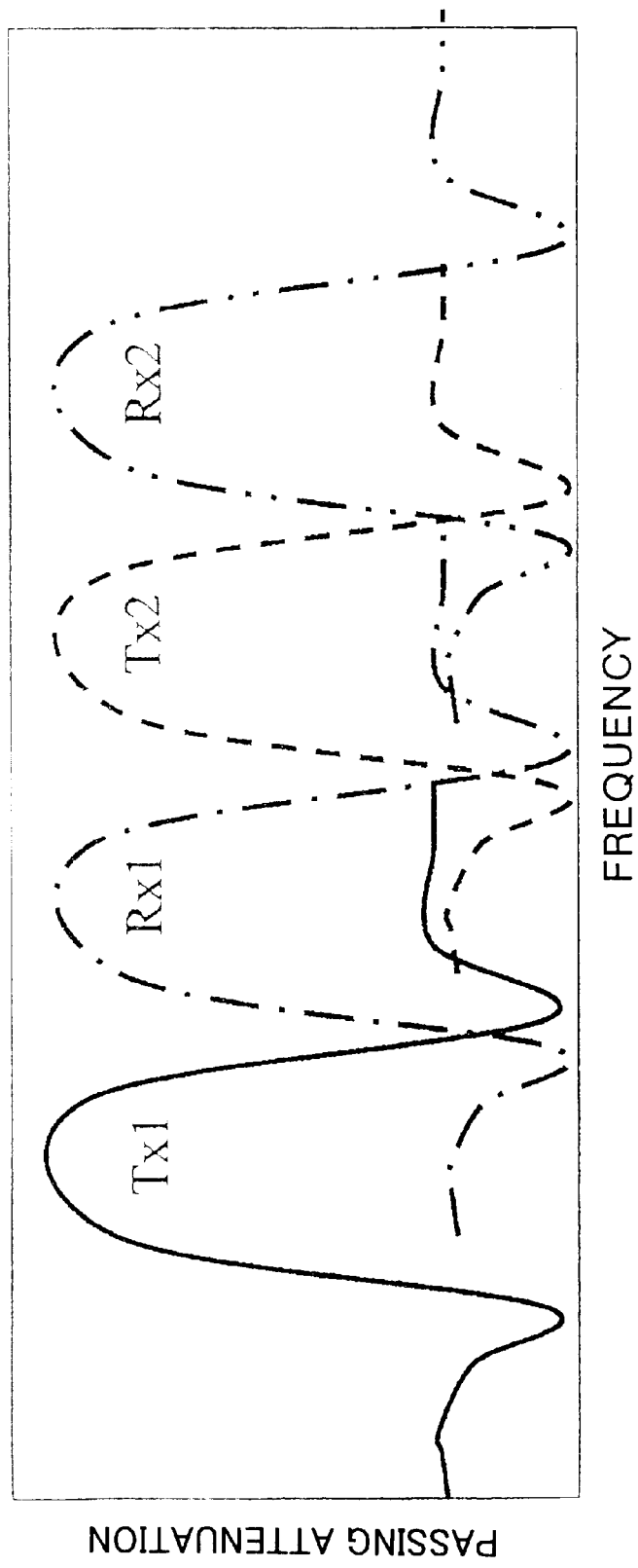
FIG. 2 shows an example of setting of center pass band frequencies in an antenna duplexer in accordance with the present invention.
Figure 3:
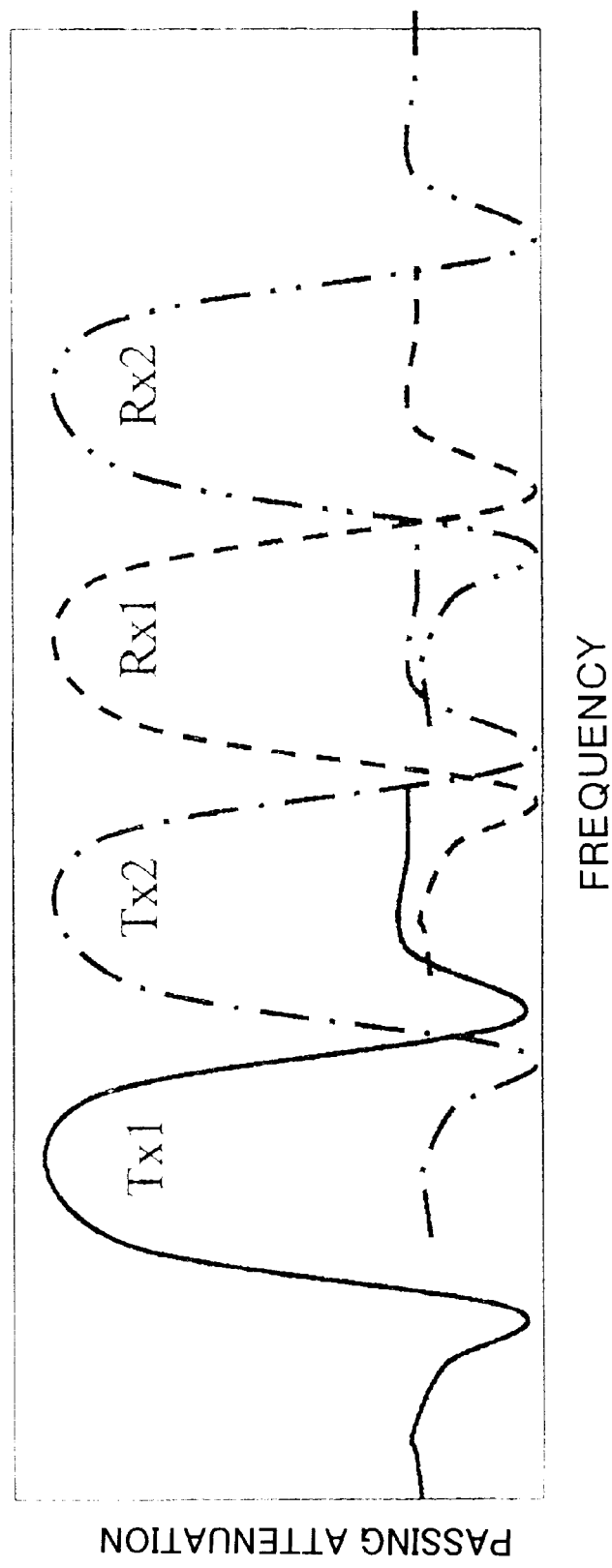
FIG. 3 shows an example of setting of center pass band frequencies in an antenna duplexer in accordance with the present invention.

FIGS. 2 and 3 show examples of setting of center pass band frequencies employed in the antenna duplexer D3 of the present invention.

The duplexers are each comprised of a combination of one transmitting SAW filter and one receiving SAW filter, and each of the filters has its own center pass band frequency.

FIG. 2 shows a case where the center pass band frequencies (Tx1 and Tx2) of the two transmitting filters and those (Rx1 and Rx2) of the two receiving filters in the two duplexers are set alternately. FIG. 3 shows a case where the center pass band frequencies (Tx1 and Tx2) of the two transmitting filters are adjacent to each other and those (Rx1 and Rx2) of the two receiving filters are adjacent to each other.

For example, for integrating two duplexers of an AMPS system (Advanced mobile Phone System, 800 MHz band) and of a PCS system (Personal Communication System, 1.9 GHz band) which are used mainly in North America into a single antenna duplexer, the frequency setting shown in FIG. 2 is used.

For integrating two duplexers of a lower channel and an upper channel of a CdmaOne system (800 MHz band) and of a lower channel and an upper channel of the PCS system (1.9 GHz band) into a single antenna duplexer, the frequency setting shown in FIG. 3 is used.

The antenna duplexer of the present invention described below is ready for both the frequency setting of FIG. 2 and FIG. 3.

Figure 4:
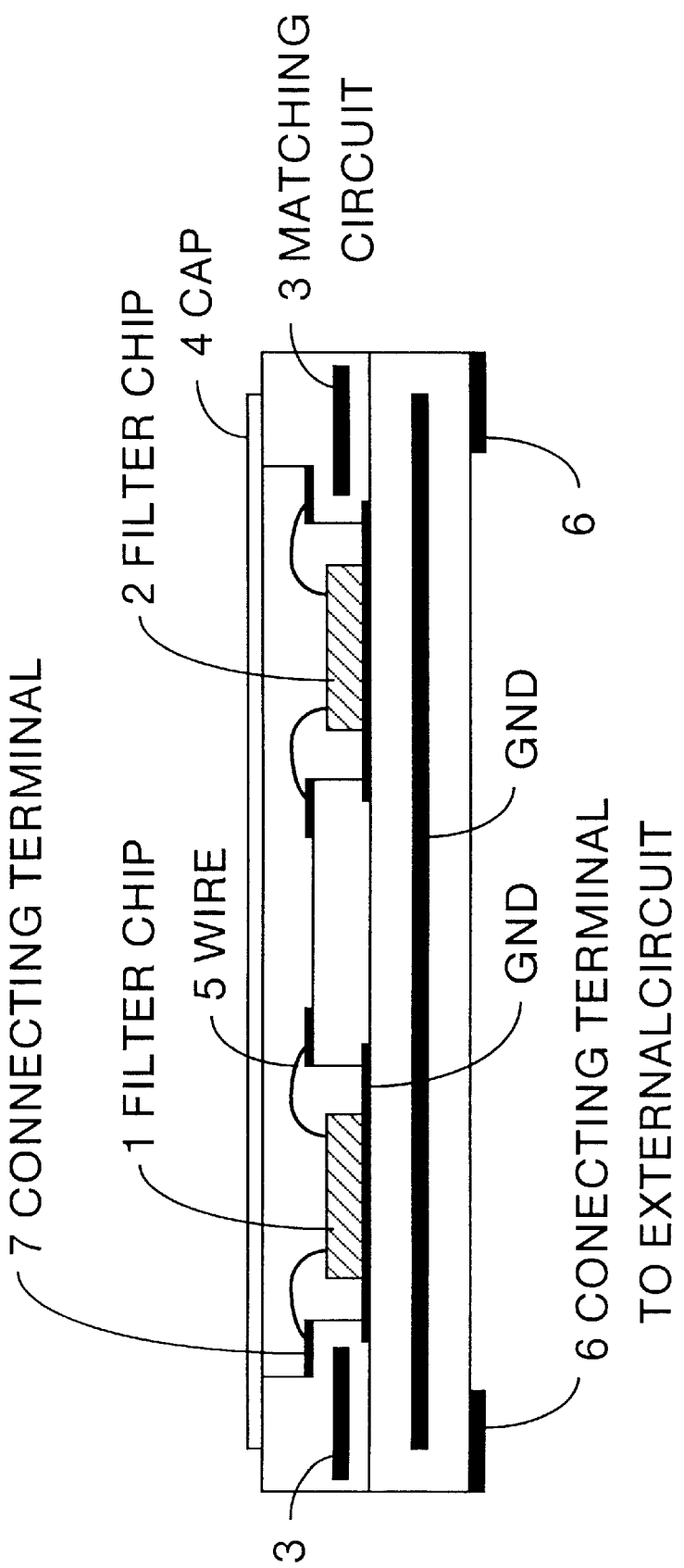
FIG. 4 is a schematic sectional view illustrating the construction of a package of an antenna duplexer in accordance with the present invention.

FIG. 4 is a schematic sectional view illustrating the construction of the package of the antenna duplexer of the present invention.

The package of the antenna duplexer is formed in a plurality of layers and is about 7.0×5.0×1.5 mm in size. The package has cavities in which two filter chips 1 and 2 are mounted. Connecting terminals 7 are provided in given positions in the periphery of the package for connection with the filter chips and with external terminals.

The filter chips and the connecting terminals of the package are connected by wires of Al, Au, Cu or the like.

Connecting terminals 6 for connection with external circuits are mounted on a bottom surface of the package, but not limited thereto.

On an upper surface of the package, a cap 4 is provided to cover the entire filter chips. Within the package, matching circuits 3 are formed in patterned strip lines and disposed in a given layout.

In each of the filter chips 1 and 2 of FIG. 4, any two of the four SAW filters (T1, T2, R1 and R2) shown in FIG. 1 are combined and placed in consideration of the positions of the connecting terminals of the duplexer package. For example, the transmitting filter T1 and the receiving filter R1 may be mounted in the filter chip 1 and the transmitting filter T2 and the receiving filter R2 may be mounted in the filter chip 2. Alternatively, the transmitting filters T1 and T2 may be mounting in the filter chip 1 and the receiving filters R1 and R2 may be mounted in the filter chip 2.

Figure 6:
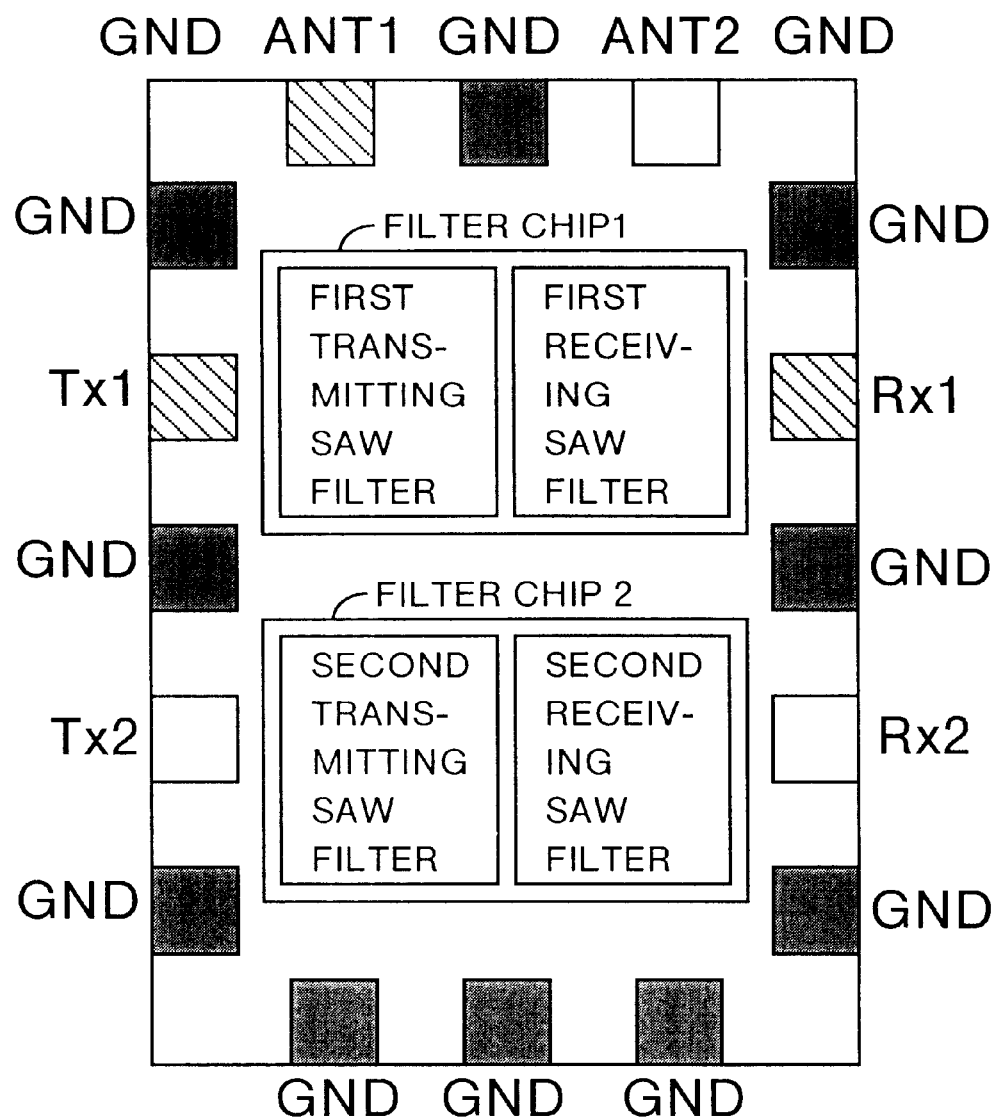
FIG. 6 shows an example of arrangement of connecting terminals in a package of an antenna duplexers in accordance with the present invention.

FIGS. 5(a), 5(b) and 6 show examples of arrangement of connecting terminals in the package of the antenna duplexer of the present invention.

The connecting terminals ANT1, ANT2, Tx1, Tx2, Rx1 and Rx2 in FIGS. 5(a), 5(b) and 6 correspond to the symbols of FIG. 1. The symbol GND denotes a grounding terminal.

In FIGS. 5(a), 5(b) and 6, as regards the transmitting terminal group (Tx1 and Tx2), the receiving terminal group (Rx1 and Rx2) and the antenna terminal group (ANT1 and ANT2), connecting terminals included in each of the terminal groups are located near to each other. Regions in which the terminal groups are arranged are separated from each other, are located in the periphery of the package and do not cross each other, characteristically.

In FIG. 6, the three terminal groups are arranged in regions along different sides of the rectangle and the regions for the groups do not cross each other planarly.

In FIGS. 5(a) and 5(b), the transmitting terminals (Tx1 and Tx2) are disposed near to each other in a region including the lower left corner, the receiving terminals (Rx1 and Rx2) are disposed near to each other in a region including the lower right corner, and the antenna terminals (ANT1 and ANT2) are disposed to each other in a region along the upper side of the rectangle. FIG. 5(a) is different from FIG. 5(b) in that the positions of the terminals in each of the groups are changed.

Filter chips 1 and 2 in FIGS. 5(a), 5(b) and 6 denote positions for actually mounting the filter chips.

To sum up, terminals belonging to one group and terminals belonging to another group are not disposed alternately in a neighboring relation. A region for disposing terminals belonging to one group and a region for disposing terminals belonging to another group are separated by one border line in plan-view arrangements shown in FIGS. 5(a), 5(b) and 6.

Figure 7:
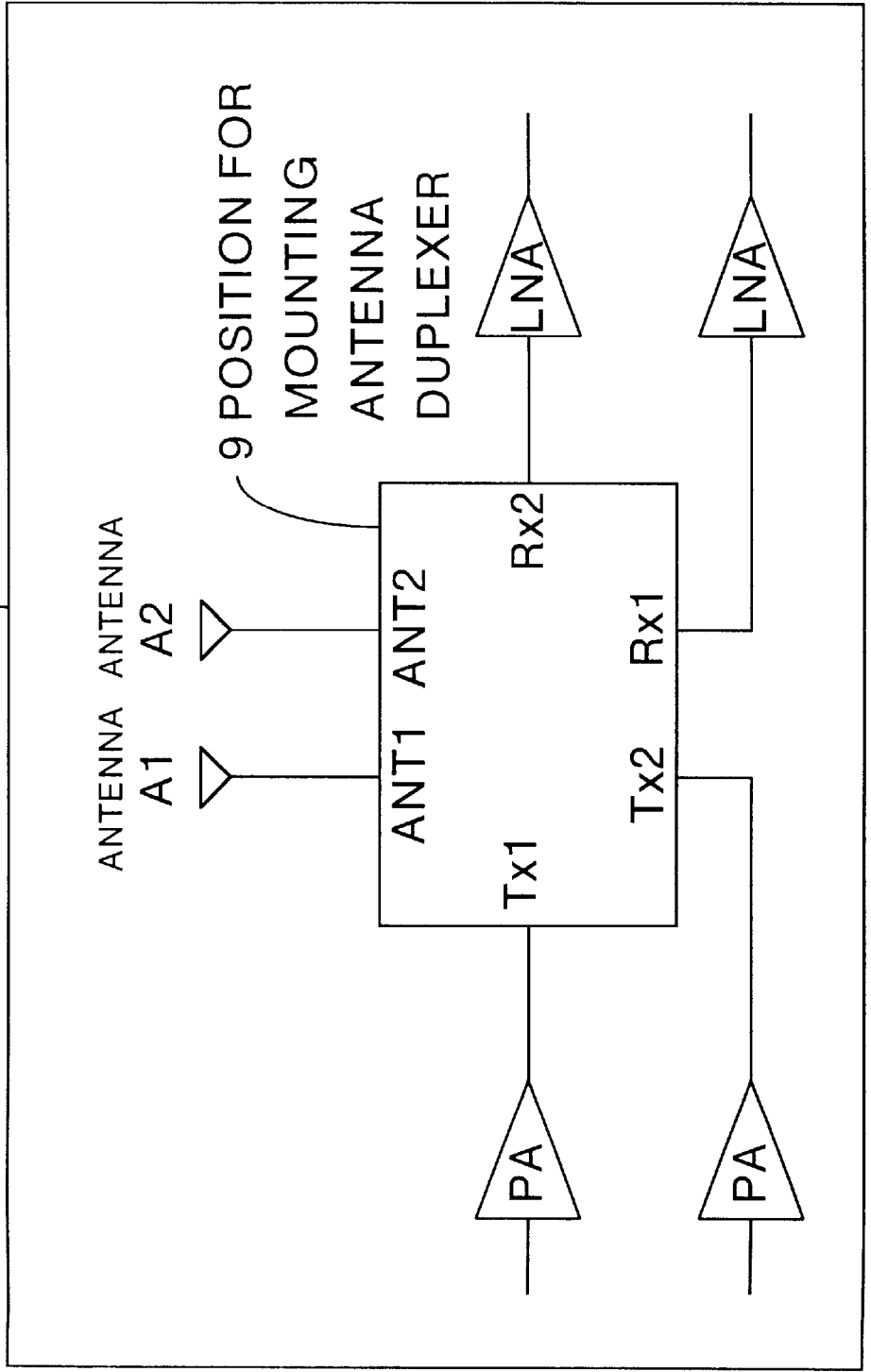
FIG. 7 is a diagram illustrating a general idea of connection of an antenna duplexer in accordance with the present invention with external circuits.

FIG. 7 shows a general idea of connection of the antenna duplexer of the present invention with the external circuits.

FIG. 7 shows a case where regions for constructing circuits of a transmission system, a receiving system and an antenna system are separated according to their functions on a printed circuit board 10. On the printed circuit board 10, disposed are wires from connecting terminals A1 and A2 for connection with antennae to ANT1 and ANT2 of an antenna duplexer mounting position 9; wires from amplifiers PA to Tx1 and Tx2 of the antenna duplexer mounting position 9; and wires from amplifiers LNA to Rx1 and Rx2 of the antenna duplexer mounting position 9, as shown in the figure.

If the package of the antenna duplexer D3 shown in FIG. 5 is mounted at the antenna duplexer mounting position 9 in FIG. 7 on the printed circuit board having the above-mentioned arrangement, the wires of the three systems do not cross each other at all in wiring including the printed circuit board 10. In other words, the wires of the three systems can be separated spatially, and therefore, interference between the two duplexers can be avoided.

FIGS. 8(a) to 8(c) and FIGS. 9(a) to 9(b) show examples of wiring connection of the connecting terminals in the package of the antenna duplexer of the present invention.

FIGS. 8(a) and 9(a) show the signal terminals in the arrangements shown in FIGS. 5(a) and 5(b), respectively, except the grounding terminals GND.

Here, the symbols P1 to P6 denote relay pads (relay terminals) for connection of the filter chips with phase matching circuits.

FIGS. 8(b), 8(c), 9(b) and 9(c) show patterns of wires between connecting terminals and matching circuits (L1 and L2) formed on layers in the multi-layered package. FIGS. 8(b) and 8(c) illustrate different layers, and so do FIGS. 9(b) and 9(c). The connecting terminals on these layers and those shown in FIGS. 8(a) and 9(a) are connected through via-holes. Two filter chips 1 and 2 are mounted within the package. In FIGS. 8(a) to 8(c) and 9(a) to 9(c), the filter chip 1 is a transmitting filter chip composed of the transmitting filters T1 and T2 shown in FIG. 1 and the filter chip 2 is a receiving filter chip composed of the receiving filters R1 and R2 shown in FIG. 1.

FIGS. 8(a) to 8(c) show an example of arrangement of the connecting terminals in which connecting wires, wires for connection with the external circuits and the patterns of the matching circuits are so disposed not to cross each other.

FIG. 8(b) shows connection between circuit elements of group 1 of FIG. 1, and FIG. 8(c) shows connection between circuit elements of group 2 of FIG. 1. In each of the figures, terminals irrelevant to connection are omitted.

For example, a terminal on the transmitting filter T1 is connected to the terminal Tx1 on the package by a wire, and a terminal on the receiving filter R1 is connected to the terminal P1 on the package by a wire.

Here, suppose that the antenna duplexer D3 shown in FIGS. 8(a) to 8(c) has been mounted on the printed circuit board of FIG. 7, the transmitting terminal Tx1 of FIG. 8(b) is connected to the power amplifier PA situated to the left, the antenna terminal ANT1 is connected to the antenna A1 located above in FIG. 7, and the receiving terminal Rx1 is connected to the low-noise amplifier LNA located at the right by a wire extending from the bottom of the receiving terminal.

Therefore, in FIG. 8(b), the wiring for connection of the connecting terminal ANT1, Tx1 and Rx1 with the external circuits (printed circuit board) and the patterned wiring of the matching circuit L1 between the terminals ANT1 and P1 do not cross in a direction of height within the package.

In FIG. 8(c), the transmitting terminal Tx2 is connected to the power amplifier PA situated at the left by a wire extending from the bottom of the transmitting terminal Tx2, the antenna terminal ANT2 is connected to the antenna A2 shown in FIG. 5, and the receiving terminal Rx2 is connected to the low-noise amplifier LNA located at the right. Also, in this case, the wiring for connection of the connecting terminal ANT2, Tx2 and Rx2 with the external circuits (printed circuit board) and the patterned wiring of the matching circuit L2 between the terminals P2, P3 and ANT2 do not cross in the direction of height within the package.

On the transmitting filters T1 and T2, mounted are input pads (P12 and P14) for connection to the transmitting terminals Tx1 and Tx2 and output pads (P11 and P13) for connection to the antenna terminals ANT1 and ANT2. For preventing the crossing of wires, the input pads (P12 and P14) are disposed near the transmitting terminals (Tx1 and Tx2) and the output pad (P11 and P13) are disposed near the antenna terminal ANT1 and the relay terminal P3, as shown in FIGS. 8(b) and 8(c).

Preferably, for facilitating the fabrication of the filter chips, the output/input pads mounted on the two transmitting filters are arranged in similar positions.

On the other hand, input pads P21 and P24 mounted on the receiving filters R1 and R2 are positioned near the receiving terminals Rx2 and Rx1, and output pads P22 and P23 are positioned near the relay terminals P2 and P1.

As shown in FIGS. 8(a) to 8(c), where the connecting terminals for the terminal groups are arranged on the duplexer package, the wiring connecting the antenna duplexer D3 and the external circuits and the matching circuits L1 and L2 do not exhibit a spatial three-dimensional crossing in the direction of height within the package. Therefore, coupling capacity is not generated which would lead to deterioration in the filter characteristics.

The package of the antenna duplexer D3 of FIGS. 8(a) to 8(b) can be realized in a size of about 7.8 (width)×5.4 (length)×1.4 (height) mm. Thus, the package is reduced in size to about 70% of an antenna duplexer produced by combining two conventional duplexers.

Figure 31:
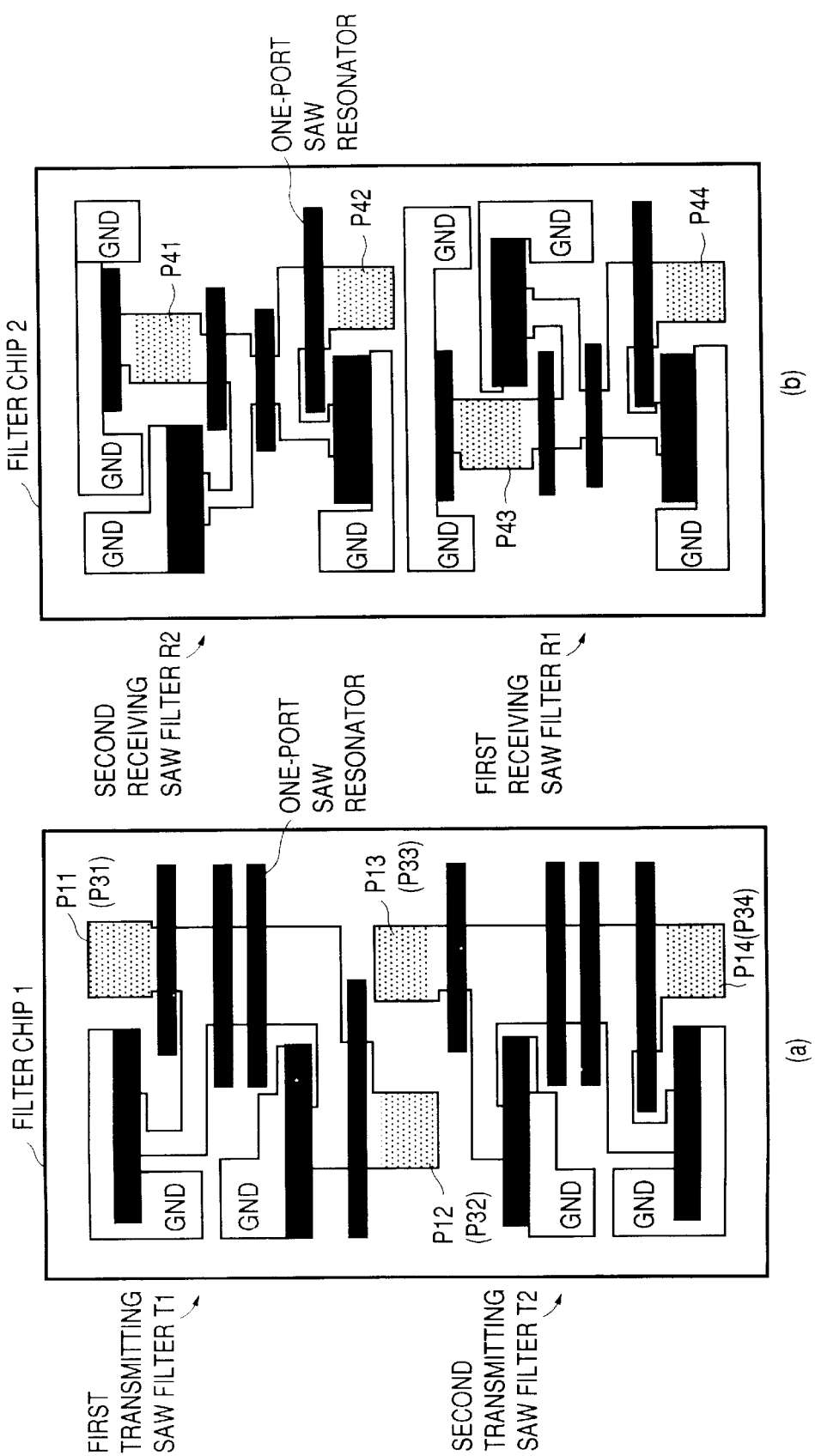
FIGS. 31(a) and 31(b) are schematic views illustrating examples of layouts inside filter chips used for an antenna duplexer in accordance with the present invention.

FIGS. 31(a) and 31(b) show examples of layouts inside the filter chips used in the antenna duplexer of the present invention. These layouts correspond to the aforesaid filter chips of FIG. 5(a) and FIGS. 8(a) to 8(c). FIG. 31(a) shows a layout of the filter chip 1 comprised of two transmitting SAW filters (T1 and T2), and FIG. 31(b) shows a layout of the filter chip 2 comprised of two receiving SAW filters (R1 and R2). The symbols P11 and P41 in FIG. 31(a) correspond to the input and output pads shown in FIGS. 8(a) to 8(c). Circuit elements elongated in a right-to-left direction in the figure are one-port SAW resonators.

On the other hand, FIGS. 9(a) to 9(c) show an example of arrangement of the connecting terminals in which wires for connection of the connecting terminals of the duplexer package with the external circuits and the patterns of the matching circuits partially have a spatial crossing, but which allows further size reduction in comparison with FIGS. 8(a) to 8(c).

FIG. 9(b) shows connection between circuit elements of group 2 of FIG. 1, and FIG. 9(c) shows connection between circuit elements of group 1 of FIG. 1.

FIGS. 9(a) to 9(c) are different from FIGS. 8(a) to 8(c) in the orientation of mounting the transmitting filter chip 1 and the receiving filter chip 2, the patterns of the matching circuits L1 and L2 and the positions of the relay pads P4 and P5.

According to these FIGS. 9(a) to 9(c), the antenna duplexer package has a size of about 7.0 (width)×5.0 (length)×1.4 (height) mm. Thus, it is possible to realize a smaller antenna duplexer than that of FIGS. 8(a) to 8(c).

According to FIG. 9(b), a wire connecting the transmitting terminal Tx2 and the external circuit PA spatially crosses the pattern of the matching circuit L2 at the left of the transmitting terminal Tx2. According to FIG. 9(c), wires connecting the transmitting terminal Tx1 and the receiving terminal Rx1 with the external circuit LNA spatially cross the pattern of the matching circuit L1 at the right of the transmitting terminal Rx1.

Therefore, in the case of FIGS. 9(a) to 9(c), since signal lines cross in two regions, where coupling capacity is generated. This causes decline of the attenuation outside the pass band which is one of filter frequency characteristics.

To avoid this decline, in the case of FIGS. 9(a) to 9(c), capacities between the matching circuits L1 and L2 and the connecting terminals (ANT1, ANT2, Tx1, Tx2, Rx1 and Rx2) must be designed to be below a predetermined value at the stage of designing the patterns of the matching circuits of the duplexer package.

Figure 10:
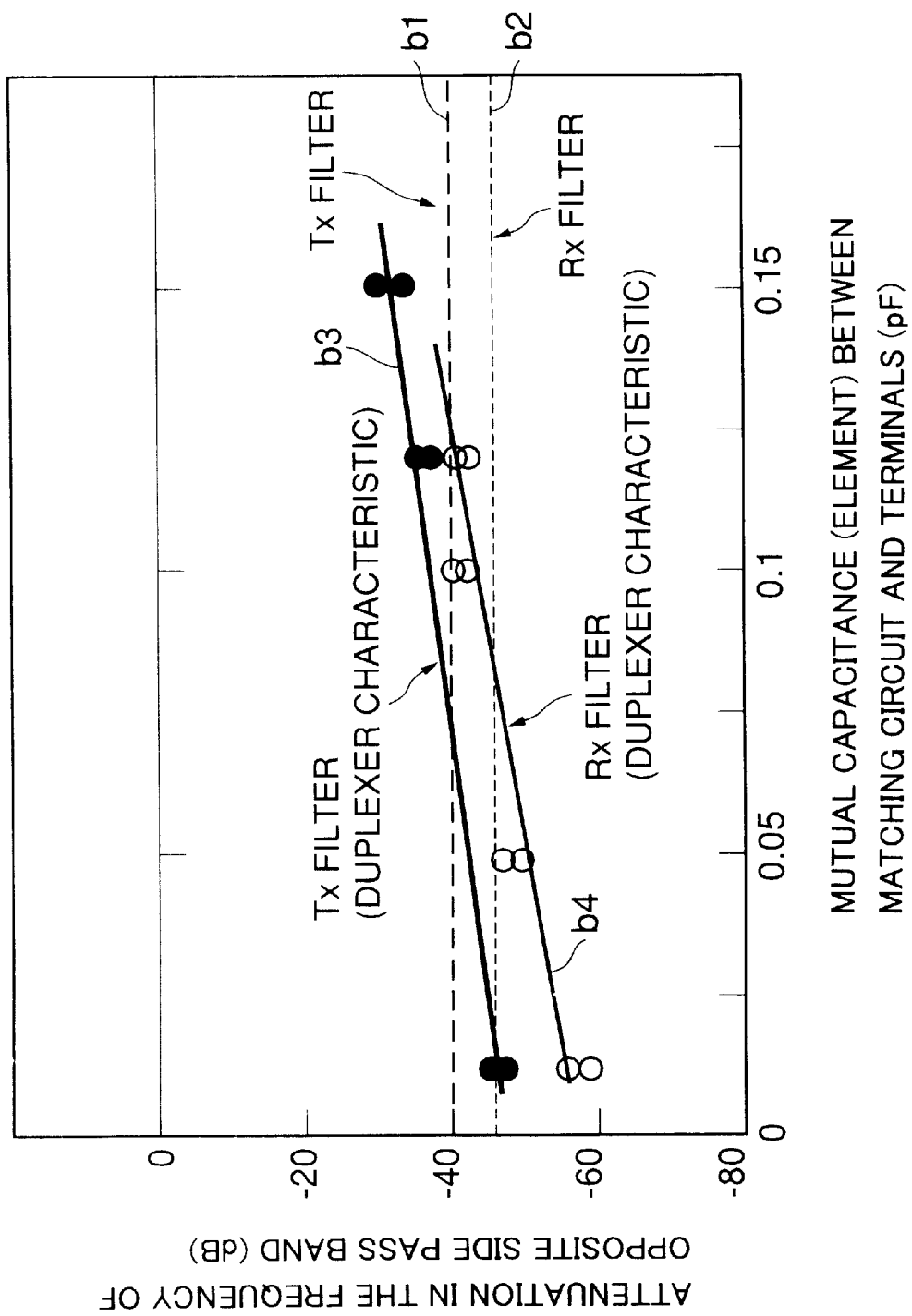
FIG. 10 is a graphical representation showing a relationship of an attenuation in an opposite side pass band to a mutual capacitance between a matching circuit and connecting terminals in duplexers of each group in an exemplary antenna duplexer package in accordance with the present invention.

FIG. 10 is a graphical representation showing a relationship of attenuation in another side pass band to a mutual capacitance between the matching circuit and the connecting terminals in duplexers of each group of the antenna duplexer package of the present invention. Here, the attenuation in said another side pass band means, for example, attenuation in the transmitting filter with respect to the pass band of the receiving filter, and attenuation in the receiving filter with respect to the pass band of the transmitting filter.

In FIG. 10, the transmitting filter is required to have an attenuation in the pass band of the opposite side (here the receiving side) represented by a segment b1, and the receiving filter is required to have an attenuation in the pass band of the opposite side (here the transmitting side) represented by a segment b2.

For example, as regards the transmitting filter, the attenuation in the opposite side pass band must be equal to or smaller than the segment b1.

According to FIG. 10, a duplexer characteristic of a designed transmitting filter is represented by a segment b3. For satisfying the above required level, the capacity value between the matching circuit and the terminals must be about 0.075 pF or smaller.

Also, a duplexer characteristic of a designed receiving filter is represented by a segment b4. For satisfying the above required level, the capacity value between the matching circuit and the terminals must be about 0.8 pF or smaller.

FIGS. 25(a), 25(b), 26(a) and 26(b) are graphical representations showing frequency characteristics with changes in the coupling capacity in the case where wires cross each other as in FIG. 9.

Figure 25:
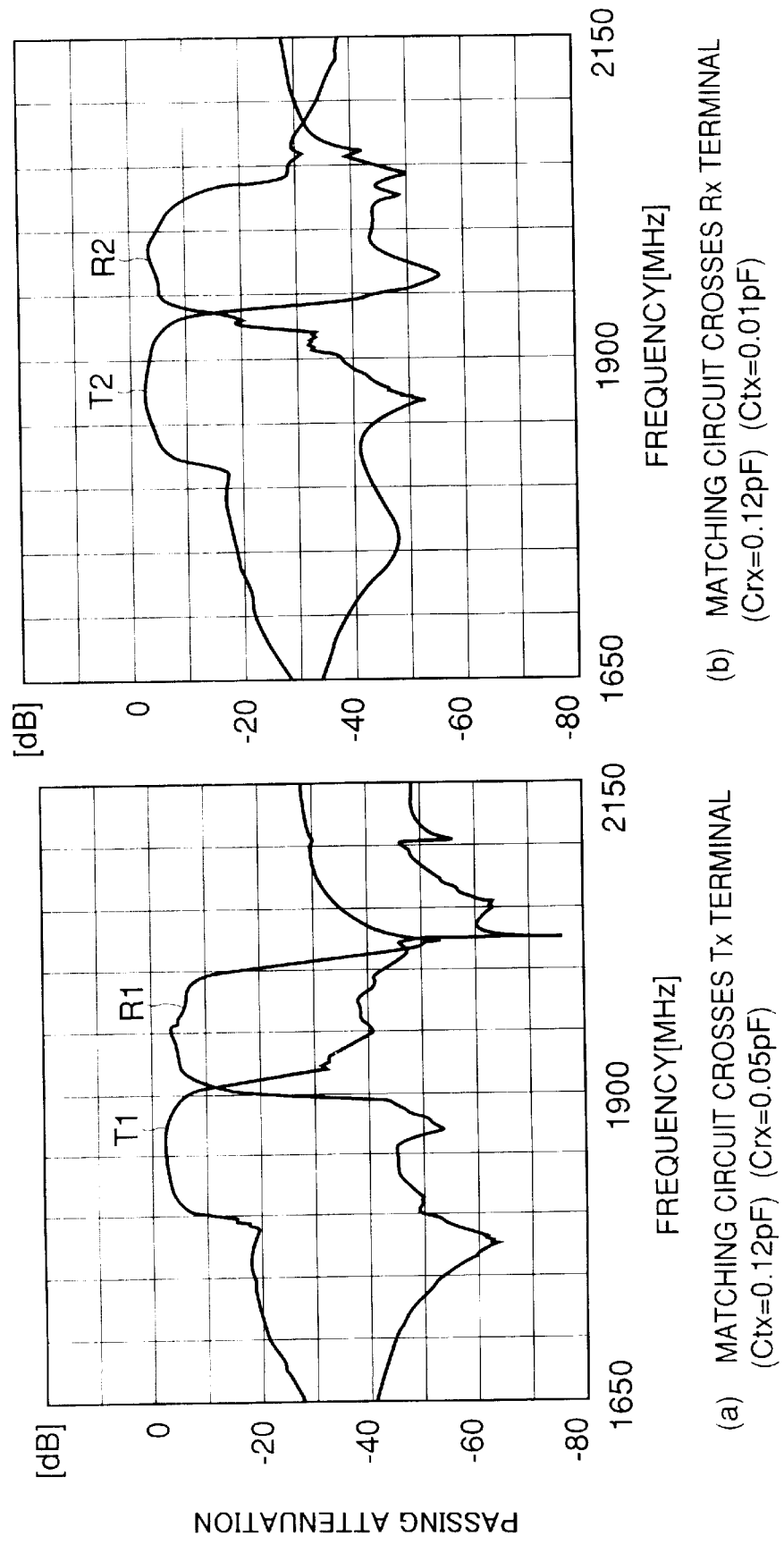
FIGS. 25(a) and 25(b) are graphical representations showing frequency characteristics of an antenna duplexer in which a matching circuit crosses a wire connected to an external circuit.
Figure 26:
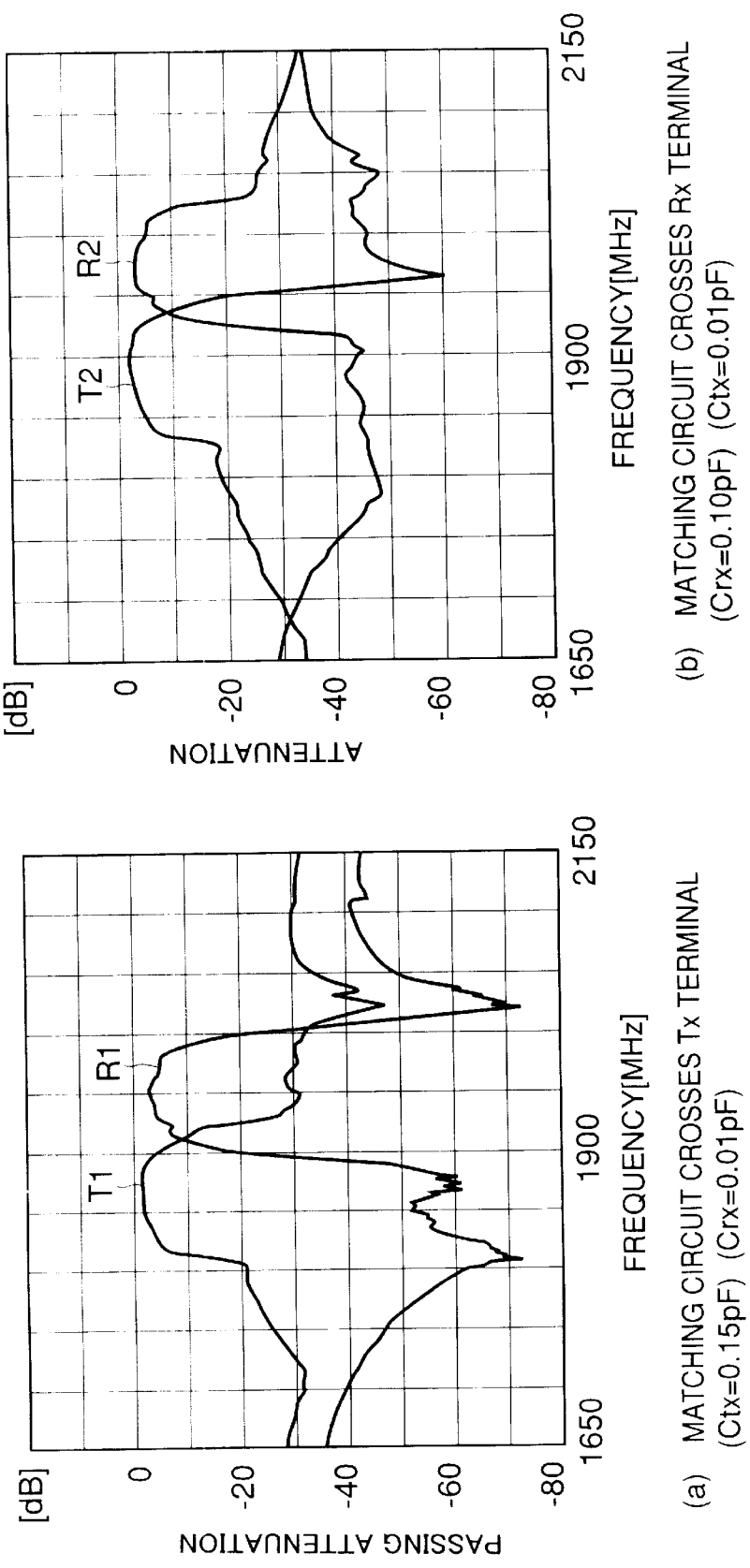
FIGS. 26(a) and 26(b) are graphical representations showing frequency characteristics of an antenna duplexer in which a matching circuit crosses a wire connected to an external circuit.
Figure 27:
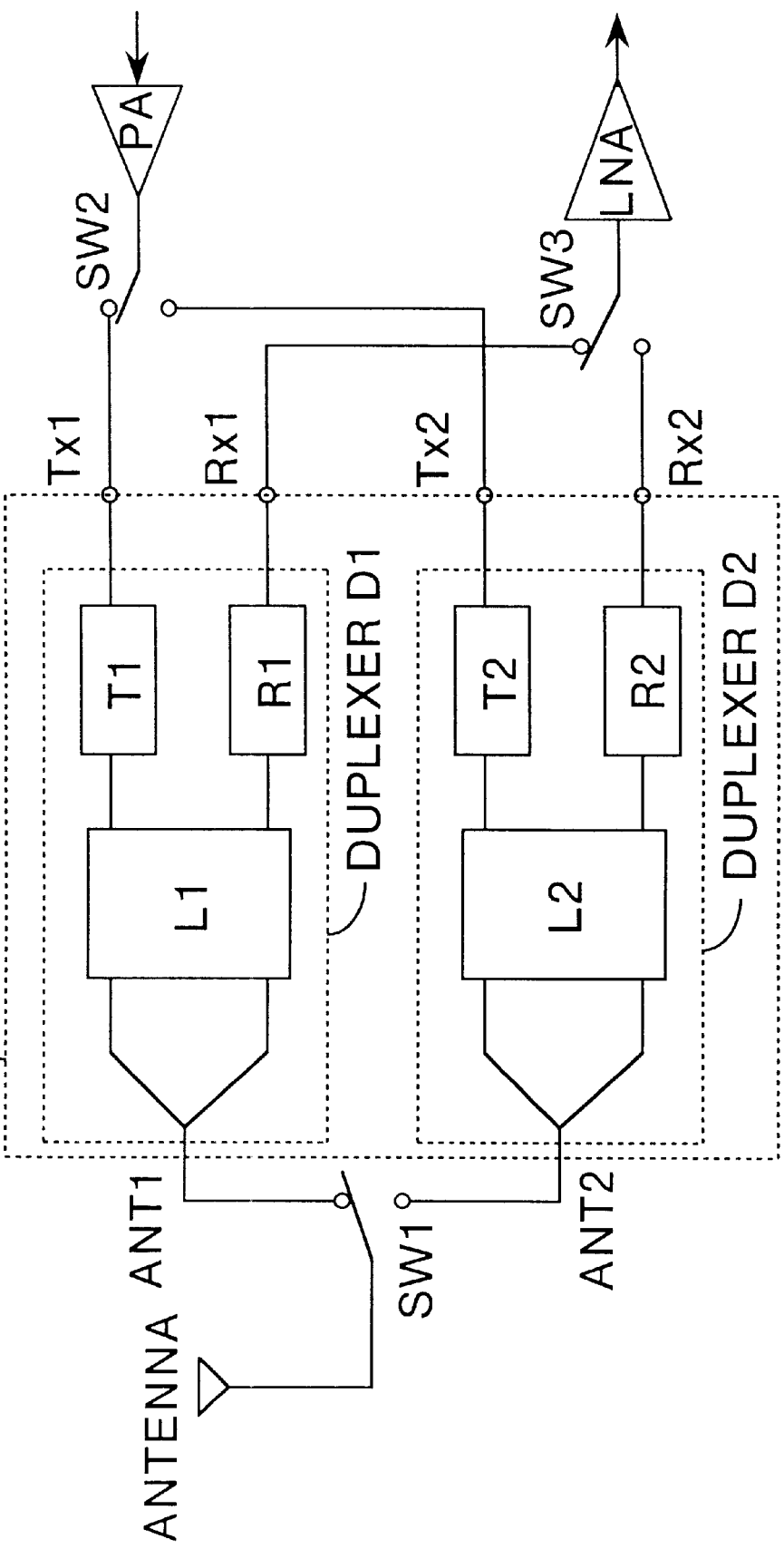
FIG. 27 is a diagram illustrating the construction of a conventional antenna duplexer.
Figure 28:
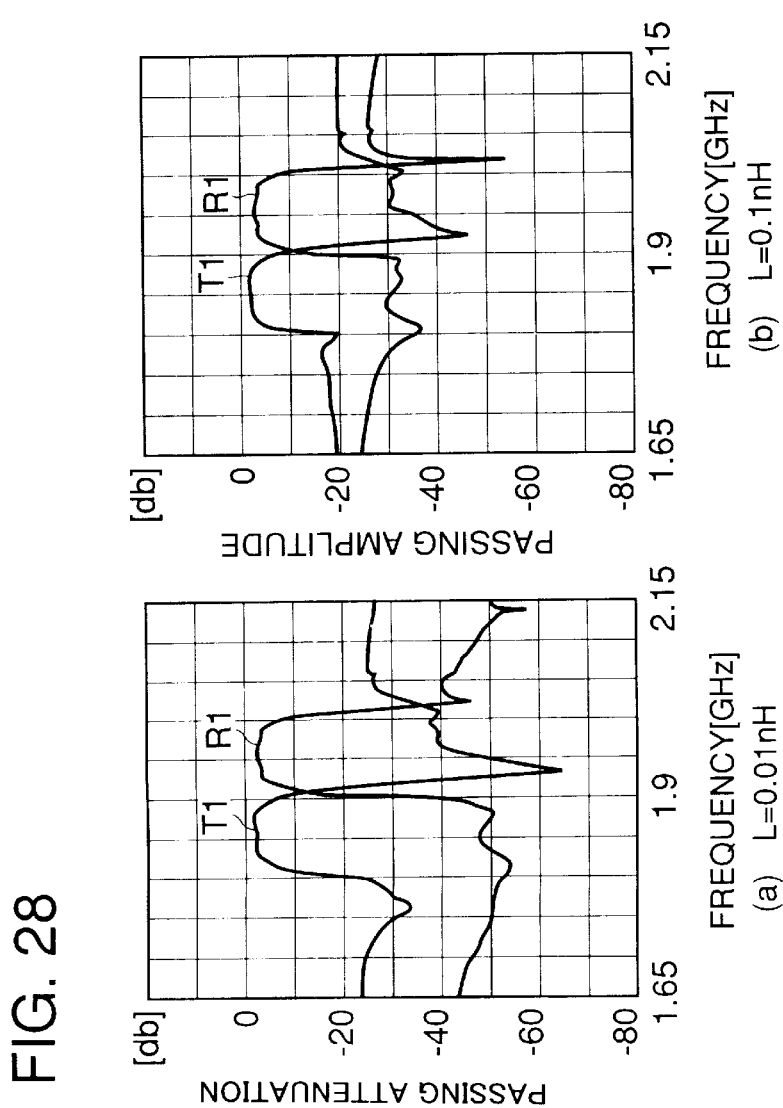
FIGS. 28(a) to 28(c) are graphical representations showing frequency characteristics of SAW filters when parasitic inductance in an antenna duplexer is varied.
Figure 29:
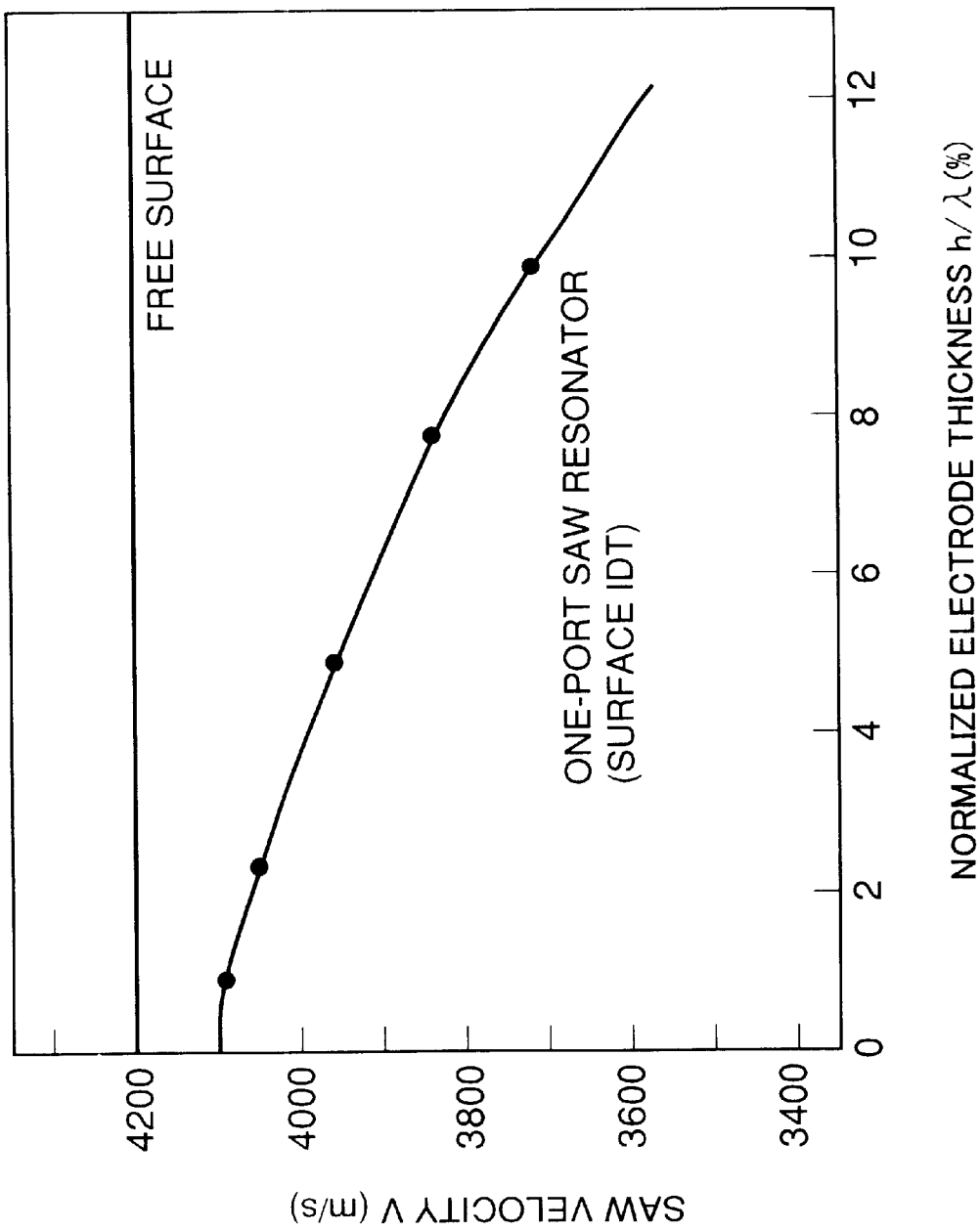
FIG. 29 is a graphical representation showing the relationship of a SAW velocity to a normalized thickness of an electrode.
Figure 30:
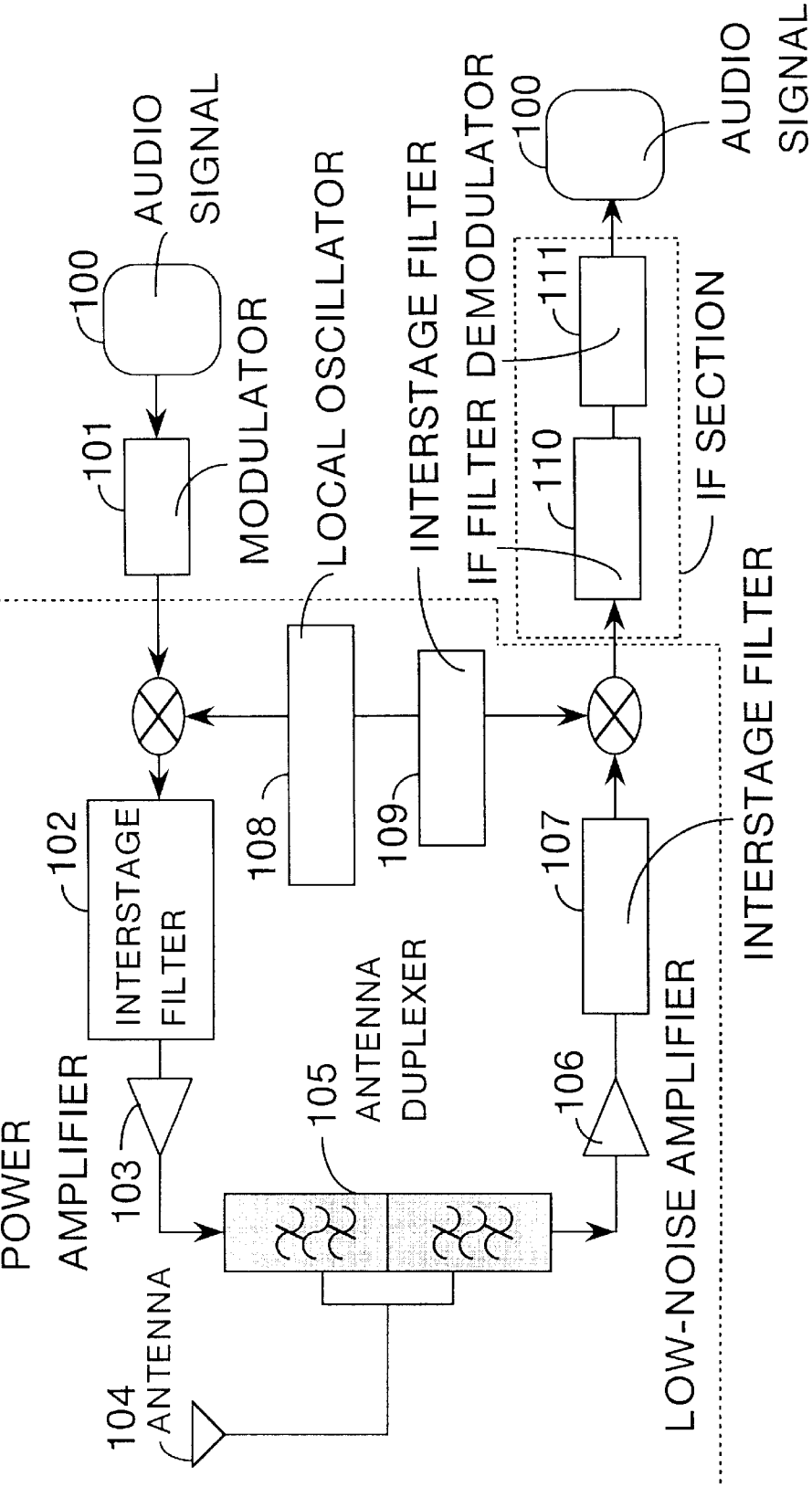
FIG. 30 is a block diagram illustrating the construction of a high frequency part of a conventionally used mobile phone.

FIGS. 25(a) and 26(a) are graphs in the case where a wire connecting the transmitting terminal Tx1 and the external circuit crosses the matching circuit L2, and FIGS. 25(b) and 26(b) are graphs in the case where a wire connecting the receiving terminal Rx1 and an external circuit crosses the matching circuit L1.

FIGS. 25(a) and 25(b) shows frequency characteristics when the coupling capacity at the crossing is 0.12 pF.

FIGS. 26(a) and 26(b) shows frequency characteristics when the coupling capacity at the crossing is 0.15 pF and 0.10 pF, respectively.

It is understood from any of the graphs that the attenuation outside the opposite side pass band where wires do not cross declines (i.e., the amount of attenuation decreases).

Accordingly, in the case of using a duplexer formed of a combination of a transmitting filter and a receiving filter having such characteristics, the patterns of matching circuits and the positions of connecting terminals are decided so that the capacities between the matching circuits (L1 and L2) and the terminals are not larger than 0.075 pF, according to the FIG. 10.

If these conditions are satisfied, even an antenna duplexer having the construction of FIGS. 9(a) to 9(c) can be adapted to have practically sufficient attenuation characteristics desired at the very beginning of designing the duplexer.

The constructions of the connecting terminals and the like in the antenna duplexer package shown in FIGS. 8(a) to 8(c) and 9(a) to 9(c) are effective where the two filter chips are separated into the transmitting filter chip 1 and the receiving filter chip 2.

In other words, the construction of the package of FIG. 8(a) to 8(c) or FIG. 9(a) to 9(c) can be used in the case the transmitting filter T1 of the group 1 of FIG. 1 and the transmitting filter T2 of the group 2 of FIG. 1 are integrated into one transmitting filter chip 1, and the receiving filter R1 of the group 1 of FIG. 1 and the receiving filter R2 of the group 2 of FIG. 1 are integrated into one receiving filter chip 2.

Incidentally, for integrating two transmitting filters into one chip, production processes of the two transmitting filters are preferably similar from the viewpoint of facilitation of production. For similarity of the production processes, the center pass band frequencies of the duplexers of the two groups need to be close. The constructions shown in FIGS. 8(a) to 8(c) and FIGS. 9(a) to 9(c) are effective where the two duplexers in the antenna duplexer have a small difference between their center pass band frequencies. For example, if the difference between the center pass band frequencies of the two duplexers is about 20% or less, the constructions of FIGS. 8(a) to 8(c) and FIGS. 9(a) to 9(c) can be employed.

On the other hand, the arrangement of the connecting terminals in the package as shown in FIG. 6 is a construction effective where the two duplexers D1 and D2 have a difference of 20% or more between their center pass band frequencies.

For example, if the case where a duplexer of 800 MHz band and a duplexer of 1.9 GHz band duplexer are integrated in one antenna duplexer, the construction of FIG. 6 can be employed.

Thus, if the difference between the center pass band frequencies of the two duplexers is large, each of the filter chips is preferably formed to include SAW filters of the individual group from the viewpoint of facilitating production processes.

FIGS. 11(a) to 11(c) show examples of wiring connection of the connecting terminals in the package of the antenna duplexer corresponding to the arrangement of the connecting terminals of FIG. 6. Here, the grounding terminals in FIG. 6 are omitted.

Symbols P7, P8 and P9 denote relay terminals for connecting the matching circuits L1 and L2 and connecting terminals.

FIG. 11(a) shows the arrangement of signal terminals out of the connecting terminals of the duplexer package. FIG. 11(b) shows the wiring connection of circuit elements of the group 1. FIG. 11(c) shows the wiring connection of circuit elements of the group 2.

As shown in FIG. 11(b), a filter chip 1 is constructed of the transmitting filter T1 and the receiving filter R1 belonging to the group 1 of FIG. 1, and a filter chip 2 is constructed of the transmitting filter T2 and the receiving filter R2 belonging to the group 2 of FIG. 1.

In FIG. 11(c), a strip line connecting the relay terminals P8 and P9 corresponds to the matching circuit L2, and a line connecting the relay (assist) terminal P8 and a terminal ANT2 corresponds to an extension line for connection between terminals.

Like the above-described FIG. 8, the antenna duplexer D3 of FIG. 11 can be mounted in the antenna duplexer mounting position 9 on the printed circuit board of FIG. 7 so that wires for the transmitting, receiving and antenna circuits do not cross each other. However, also in this case, since the matching circuits L1 and L2 cross wires to external circuits at the right of a terminal Rx1 and at the left of a terminal Tx2, the antenna duplexer needs to be designed such that the capacities between the matching circuits and terminals are reduced to a given value (0.075 pF) or below in consideration of coupling capacities generated at crossings.

In the case of FIGS. 11(a) to 11(c), the package of the antenna duplexer can be about 7.5 (length)×5.0 (width)×1.5 (height) mm in size. Thus, size reduction of antenna duplexers is also possible as in the cases of FIGS. 8(a) to 8(c) and FIGS. 9(a) to 9(c).

Figure 32:
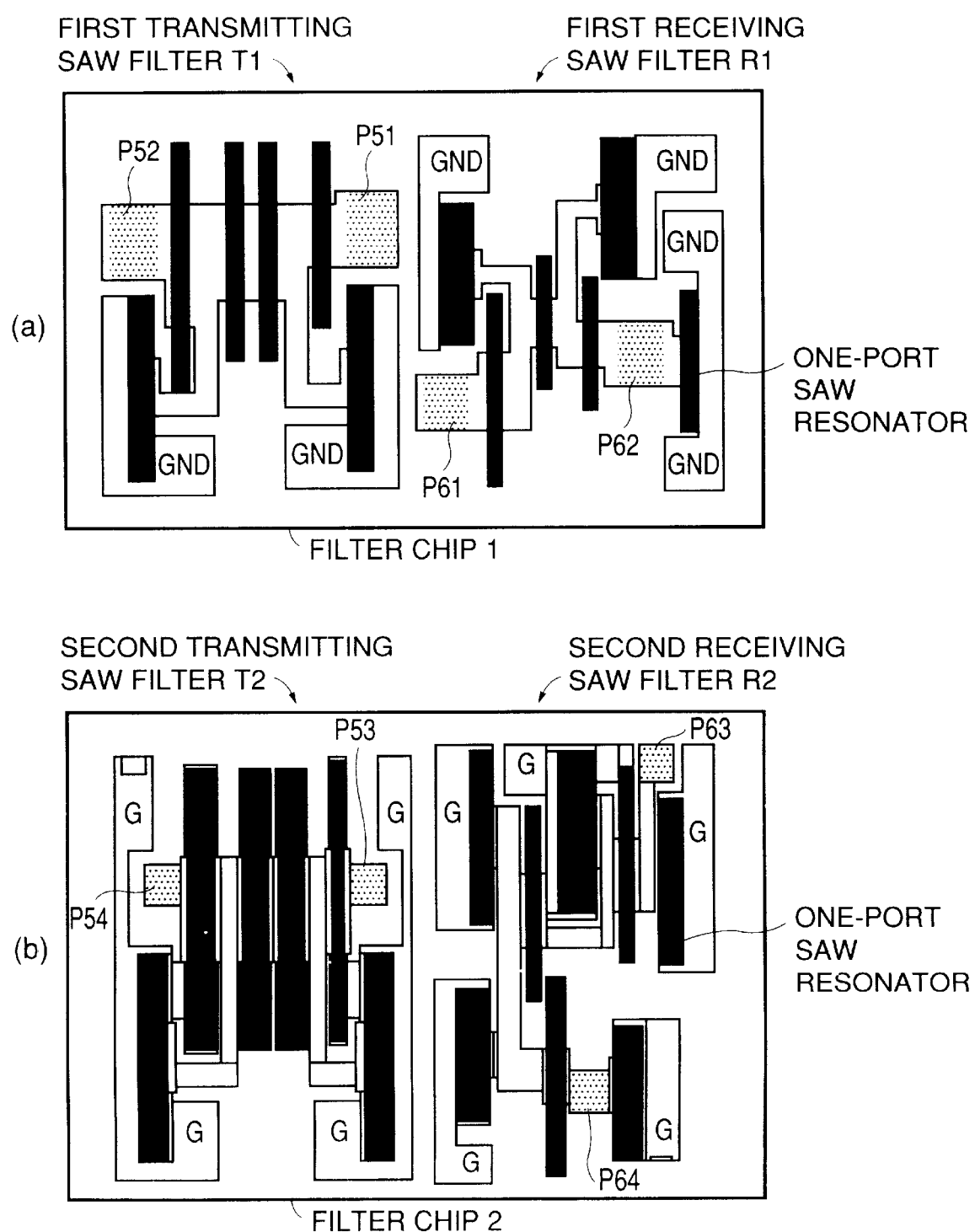
FIGS. 32(a) and 32(b) are schematic views illustrating examples of layouts inside filter chips used for an antenna duplexer in accordance with the present invention.

FIGS. 32(a) and 32(b) show examples of layouts inside filter chips as shown in FIGS. 6(a) to 6(c) and FIGS. 11(a) to 11(c). FIG. 32(a) illustrates a layout of the filter chip 1 composed of a first transmitting SAW filter T1 and a first receiving SAW filer R1, and FIG. 32(a) illustrates a layout of the filter chip 2 composed of a second transmitting SAW filter T2 and a second receiving SAW filer R2.

Figure 12:
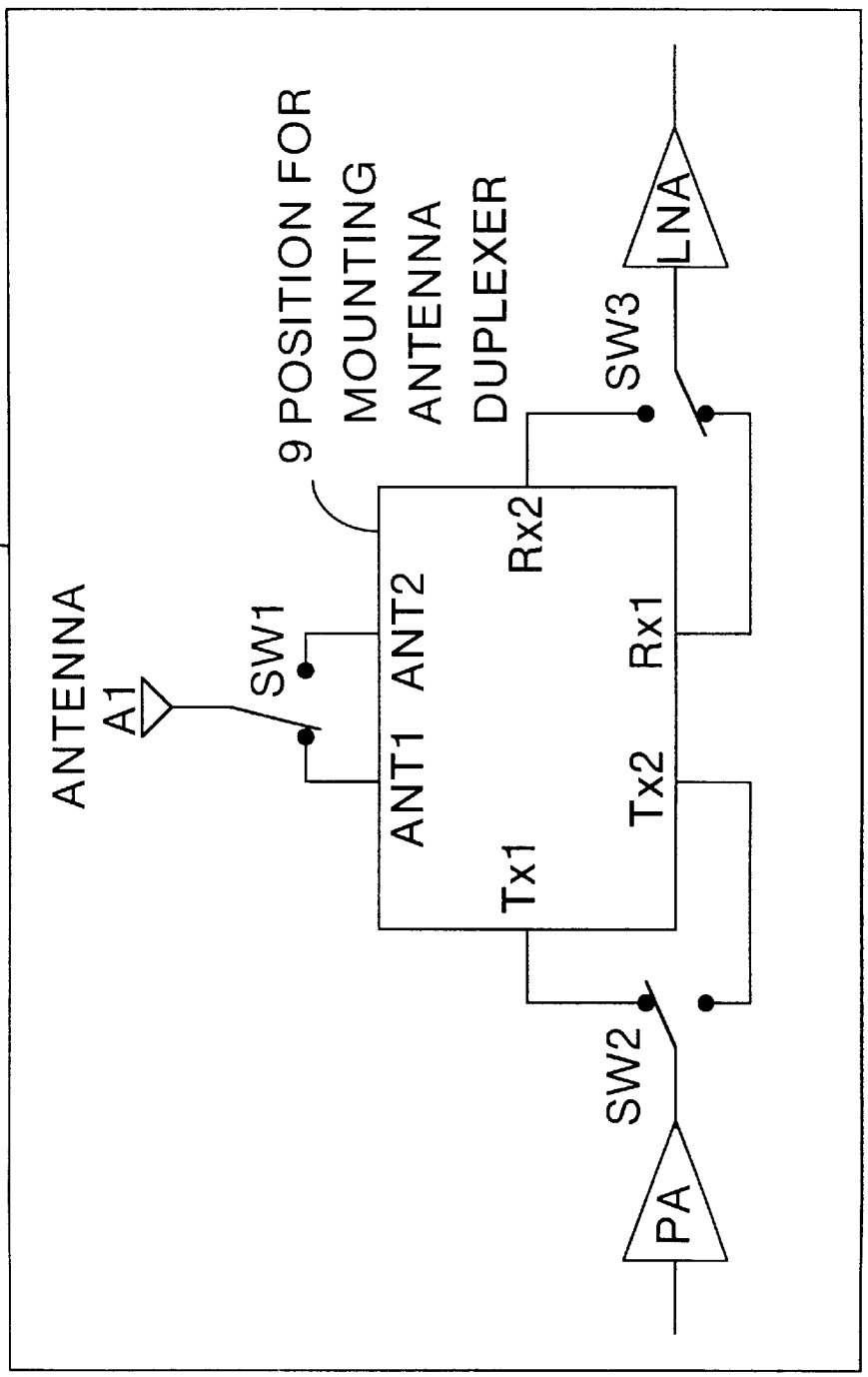
FIG. 12 is a diagram illustrating a general idea of connection of an antenna duplexer in accordance with the present invention with external circuits in the case where a printed circuit board is provided with switches.

Next, in FIG. 12, shown is a general idea of connection of the antenna duplexer of the present invention with external circuits in the case where a printed circuit board 10 is provided with switches.

FIG. 12 differs from FIG. 7 in that three RF switches (SW1, SW2 and SW3) are provided and thereby only one antenna A1, one transmitting power amplifier PA and one receiving low-noise amplifier LNA are used.

Each of the RF switches are switched by an external circuit, not shown. For example, FIG. 12 shows a state where the duplexer D1 of the group 1 of FIG. 1 is used. For using the duplexer D2 of the group 2, all the three switch may be switched to the opposite side.

With this construction, though the RF switches are necessary, the external circuits can be partially excluded. Therefore, the size of the antenna duplexer including its peripheral circuits can be reduced.

Further, if pass bands of SAW filters of the two duplexers overlap each other, the RF switches may partially be able to cut out in some cases.

Figure 13:
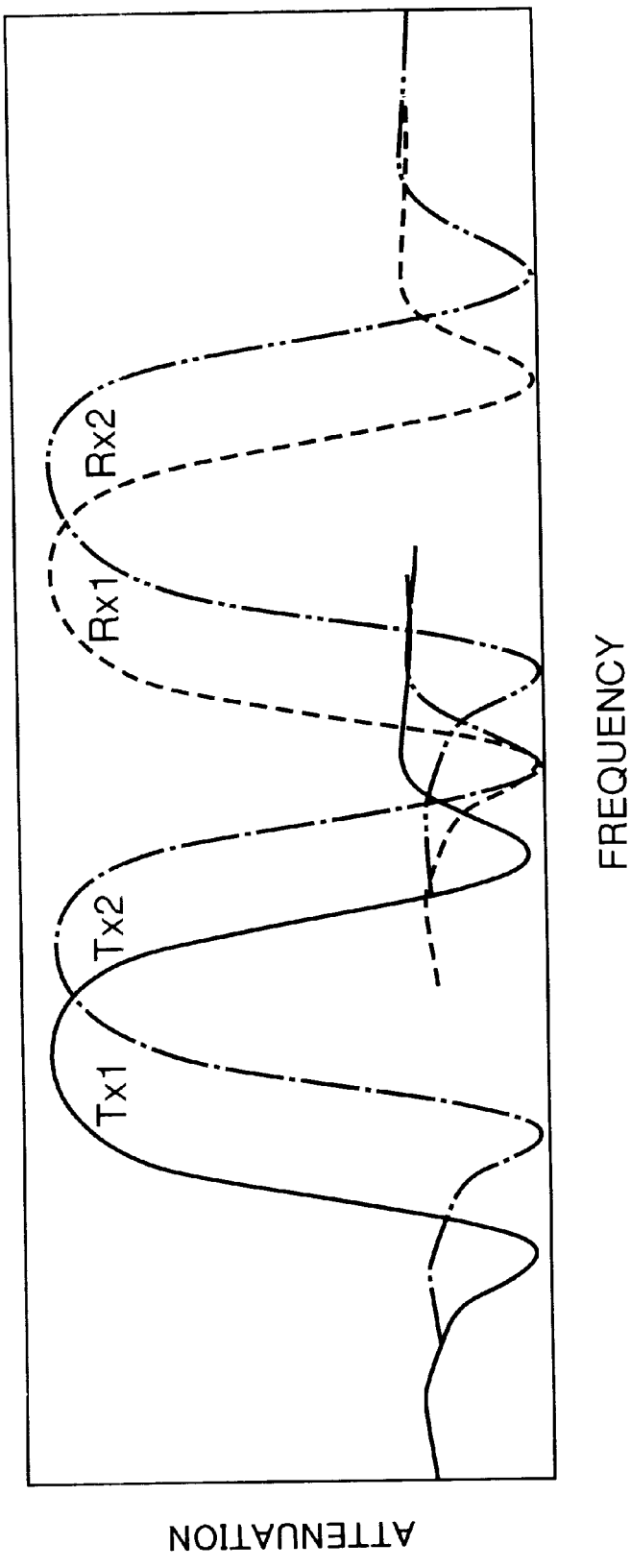
FIG. 13 is a graphical representation showing the frequency response in the case where the pass bands of transmitting filters T1 and T2 of two duplexers overlap each other and the pass bands of receiving filters R1 and R2 of the two duplexers overlap each other.

FIG. 13 is a graphical representation showing a relationship between passing amplitude and frequency in the case where the pass bands of the transmitting filters T1 and T2 of the two duplexers overlap each other and the pass bands of the receiving filters R1 and R2 of the two duplexers overlap each other. In this case, the antenna duplexer and external circuits may be connected as shown in FIG. 14.

Figure 14:
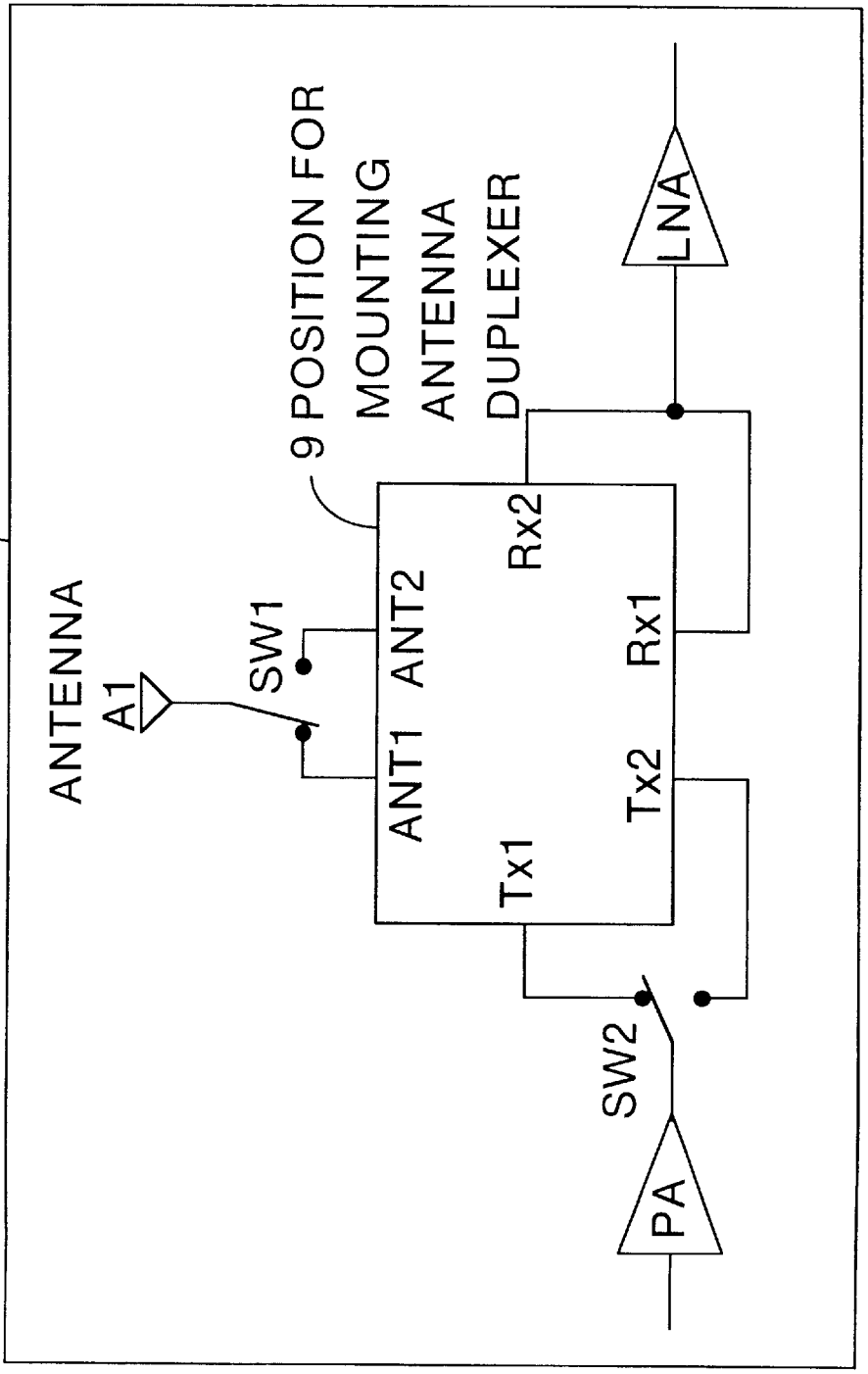
FIG. 14 is a diagram illustrating a general idea of connection of an antenna duplexer in accordance with the present invention with external circuits.

In FIG. 14, RF switches are required on a transmitting terminal side and on an antenna terminal side for minimizing power loss between the PA and the antenna. However, on a receiving side, an RF switch is omitted because the RF switch would be located before signals are amplified (before an LNA) and input from the antenna is separated. With this construction, one RF switch can be omitted in comparison with FIG. 12. Thus the size of the antenna duplexer, including its peripheral circuits, can be reduced further. Also, it is possible to suppress deterioration (distortion of a modulating signal, increased loss) in filter characteristics which may result from the existence of RF switches.

Next, explanation is given of the circuit construction of a SAW filter integrated in each filter chip.

In the explanation below, the center pass band frequency F1 of the transmitting filters T1 and T2 of the duplexers D1 and D2 are lower than the center pass band frequency F2 of the receiving filters R1 and R2, i.e., F1<F2. However, the invention is not limited thereto, and F1 may be larger than F2.

SAW filters are used for the transmitting filters (T1 and T2) and the receiving filters (R1 and R2) from the viewpoint of size reduction. Especially, in consideration of the matching of impedance, used are ladder-configured SAW filters in which a plurality of one-port SAW filters are disposed as series-arm resonators and as parallel-arm resonators.

FIGS. 15(a) and 15(b) show examples of circuitry in the SAW filters having lower pass band frequencies, i.e., the transmitting filters T1 and T2.

In FIGS. 15(a) and 15(b), S1 to S3 denote resonators on a series arm, P1 to P3 denote resonators on parallel arms, and K1 to K3 denote inductance elements such as wires. Here, terminals C2 and C2' and terminals C4 and C4' at the right in FIGS. 15(a) and 15(b), respectively, are terminals connected to the antenna terminal ANT1 (or ANT2), and terminals C1 and C1' and terminals C3 and C3' are terminals connected to the transmitting terminals Tx1 and Tx2.

Accordingly, the SAW filters having the lower center pass band frequencies shown in FIGS. 15(a) and 15(b) are characterized in that the resonator S1 on the series arm is first connected to the antenna terminal. Both the constructions illustrated in FIGS. 15(a) and 15(b) may be used as transmitting filters, but that of FIG. 15(b) can be smaller in size because the number of parallel-arm resonators in FIG. 15(b) is smaller than that in FIG. 15(a) by one.

FIGS. 16(a) and 16(b) show examples of circuitry in the SAW filters having higher pass band frequencies, i.e., the receiving filters R1 and R2.

In FIGS. 16(a) and 16(b), terminal C5 and C5' and terminals C7 and C7' at the left in the figures are terminals connected to the antenna terminal ANT1 (or ANT2), and terminal C6 and C6' and terminals C8 and C8' at the right in the figures are terminals connected to the receiving terminals Rx1 and Rx2.

Accordingly, the SAW filters having the higher center pass band frequencies shown in FIGS. 16(a) and 16(b) are characterized in that the parallel resonator P3 is first connected to the antenna terminal.

Both the constructions illustrated in FIGS. 16(a) and 16(b) may be used as receiving filters, but that of FIG. 16(b) can be smaller in size because the number of series-arm resonators in FIG. 16(b) is smaller than that in FIG. 16(a) by one.

Figure 16:
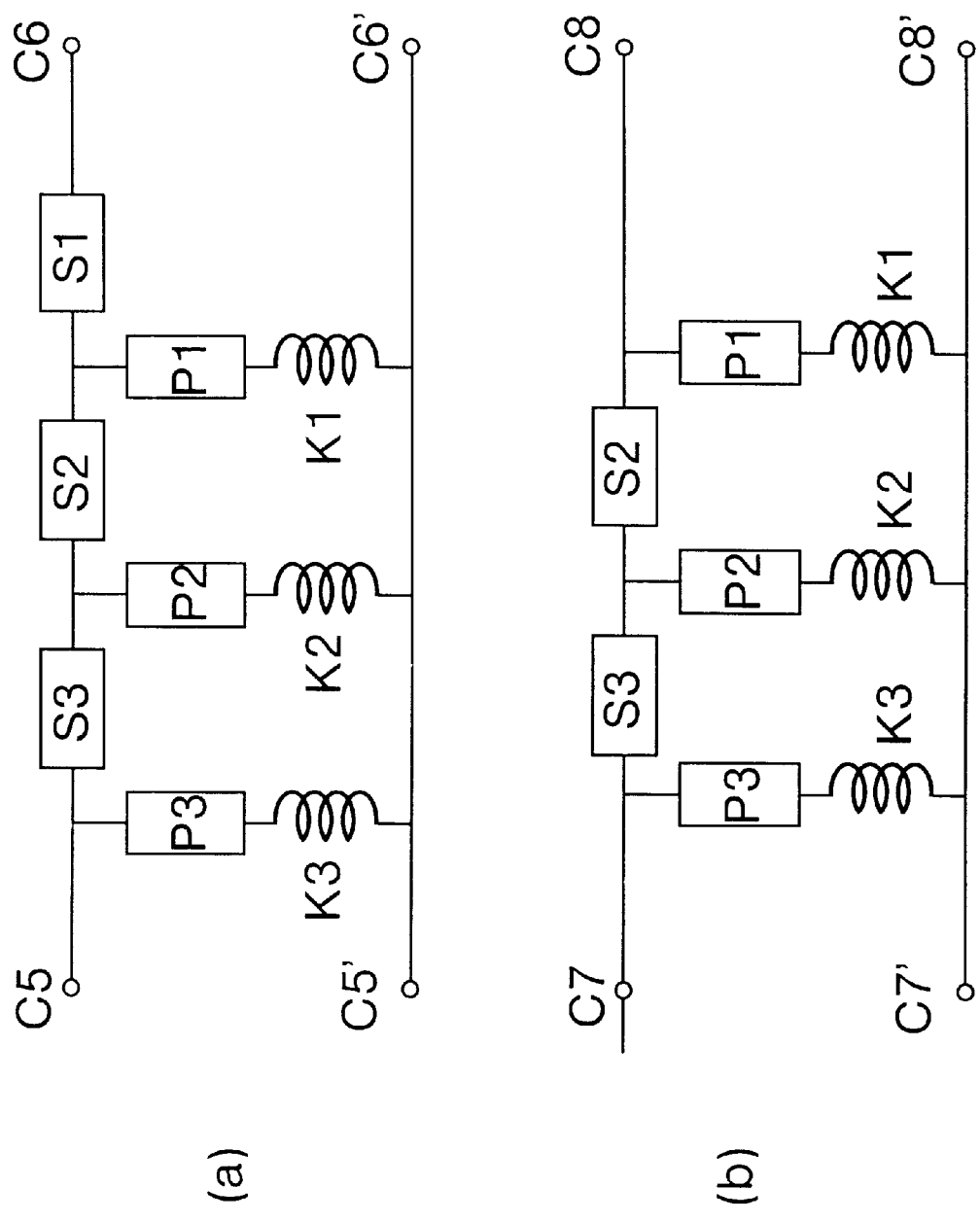
FIGS. 16(a) and 16(b) are diagrams illustrating examples of circuitry in SAW filters having higher pass band frequencies (receiving filters R1 and R2)
Figure 17:
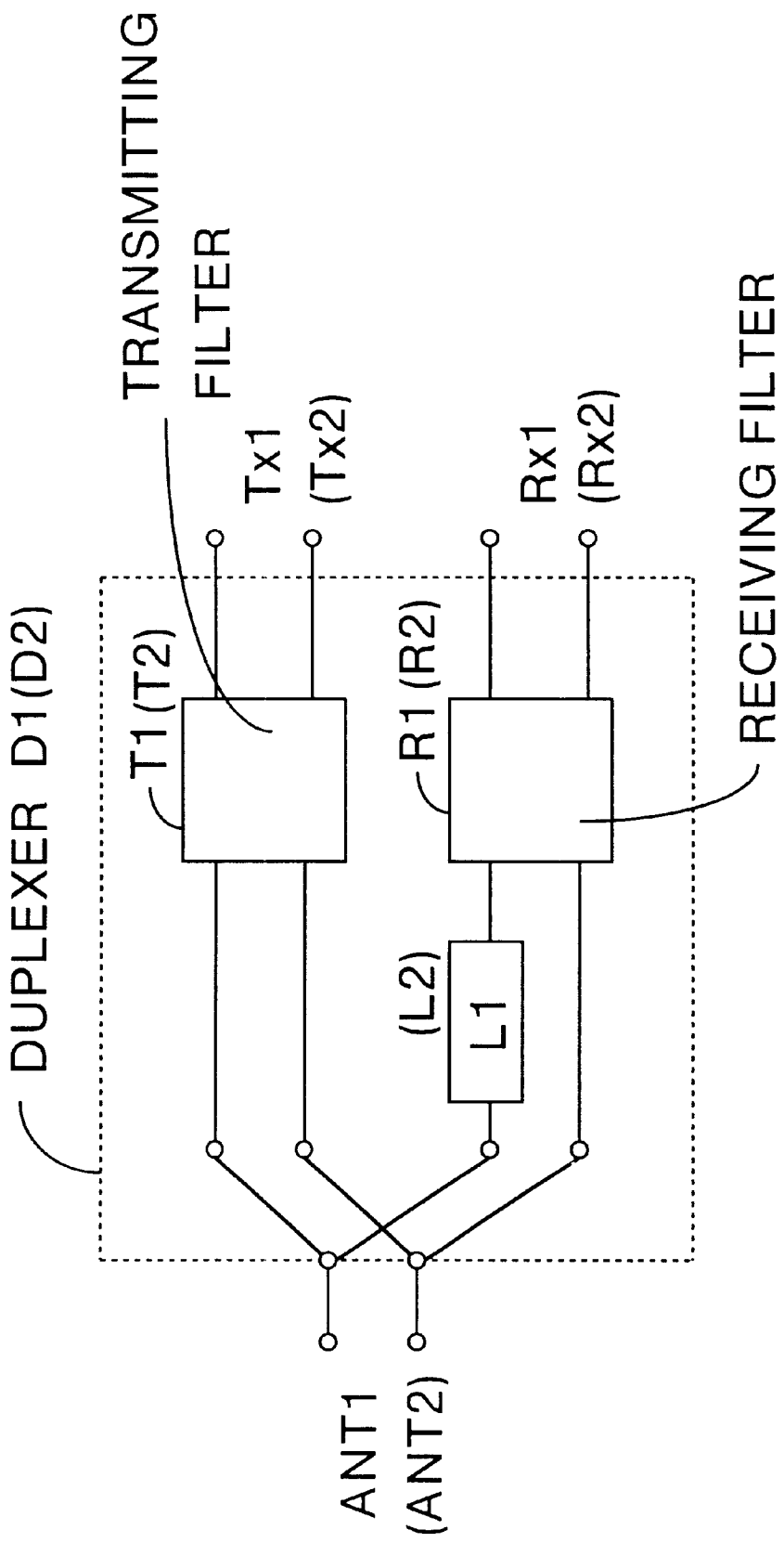
FIG. 17 is a diagram illustrating a general construction of a duplexer D1 in accordance with the present invention in the case where the SAW filters of FIG. 15 and FIG. 16 are used as a transmitting filter T1 and a receiving filter R1, respectively.

FIG. 17 shows a general construction of the duplexer D1 of the present invention where the SAW filters of FIG. 15(a) or (b) and FIG. 16(a) or (b) are used as the transmitting filter T1 and the receiving filter R1, respectively.

If the SAW filters of FIG. 15(a) or (b) and FIG. 16(a) or (b) are thus used as the transmitting filter T1 and the receiving filter R1, respectively, almost satisfactory frequency characteristics (attenuation outside the pass band) of the duplexer can be obtained by providing a matching circuit L1 only on a side of the filter having the higher pass band frequency. This is because of difference in characteristics due to the connection of the resonators in the ladder-configured circuits.

FIGS. 20(a) to 20(e) shows characteristics of ladder-formed SAW filters for comparison.

FIG. 20(a) shows a basic construction of a SAW filter of a so-called T-form circuit which is used as the filter having the lower center pass band frequency (transmitting filter T1) in FIG. 15(a) or (b).

FIG. 20(b) is a polar chart of FIG. 20(a). In this T-form filter, a so-called stop-band is situated on a higher frequency side of the pass band (see FIG. 20(e)). In other words, the polar chart (FIG. 20(b)) corresponds to SB1 of FIG. 20(e). This is referred to as an upper side stop-band.

On the other hand, FIG. 20(c) shows a basic construction of a so-called π-form SAW filter which is used as the filter having the higher center pass band frequency (receiving filter R1) in FIG. 16(a) or (b).

FIG. 20(d) is a polar chart of FIG. 20(c). In this π-form filter, the stop-band is situated on a lower frequency side of the pass band (see FIG. 20(e)). In other words, the polar chart (FIG. 20(d)) corresponds to SB2 of FIG. 20(e). This is referred to as a lower side stop-band.

The central parts PB1 and PB2 in the polar charts of FIGS. 20(b) and 20(d) means the pass bands of the filters.

As regards the matching of impedance, according to the polar chart of FIG. 20(b), since the stop-band is on the higher frequency side of the pass band, the impedance is large and reflection coefficient is also large (the reflection coefficient is larger as it is closer to the circumference of the chart), the matching circuit is not necessary. On the other hand, according to the polar chart of FIG. 20(d), since the stop-band is on the lower frequency side of the pass band, the impedance is low, though the reflection coefficient is large. Therefore the matching circuit is required for increasing the impedance.

Thus it is understood that in the case where the duplexer shown in FIG. 17 is formed by using the SAW filters of FIGS. 15(a) or (b) and 16(a) or (b) in which the basic constructions of FIGS. 20(a) and 20(c) is combined, the provision of the matching circuit L1 only for the SAW filter having the higher center pass band frequency (receiving filter of FIG. 17) is sufficient from the viewpoint of the matching of impedance in the duplexer.

Figure 18:
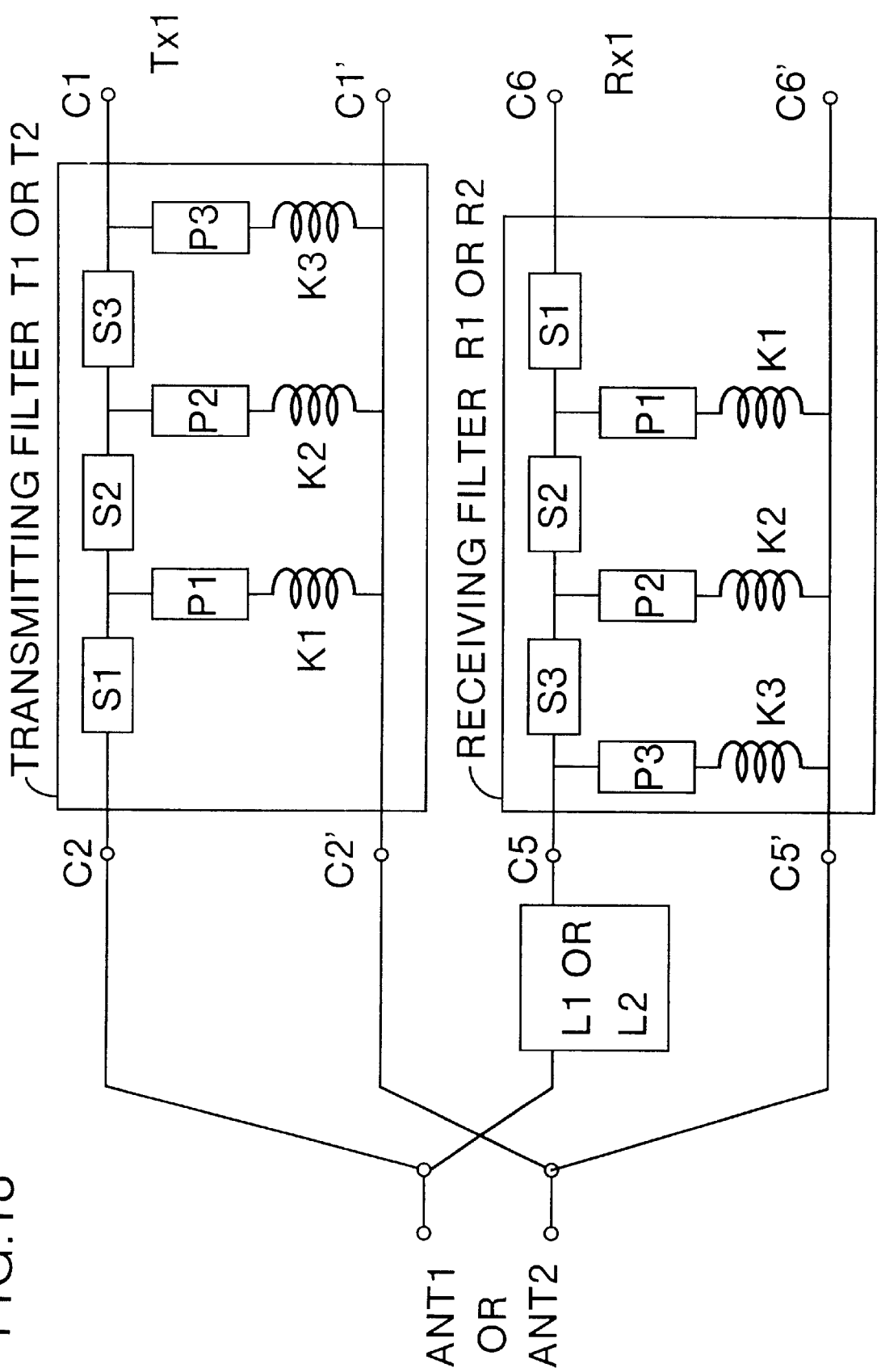
FIG. 18 is a diagram illustrating an example of circuitry of the duplexer D1 as shown in FIG. 17.
Figure 19:
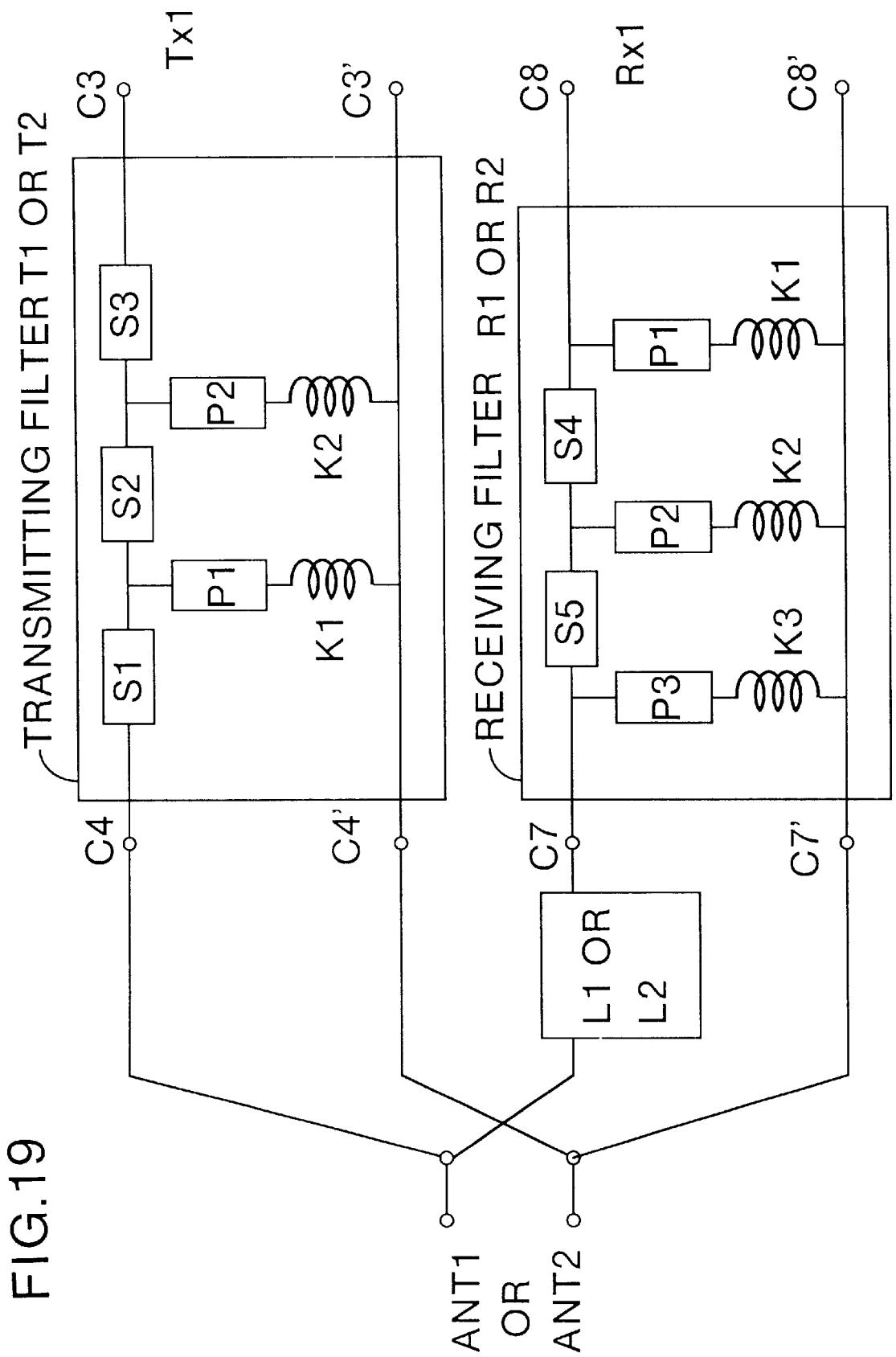
FIG. 19 is a diagram illustrating an example of circuitry of the duplexer D1 as shown in FIG. 17.

FIGS. 18 and 19 show examples of circuitry of the duplexer D1 as corresponds to FIG. 17.

FIG. 18 is a circuit diagram in which the SAW filters of FIGS. 15(a) and 16(a) are used as the transmitting and receiving filters T1 and R1, respectively. FIG. 19 is a circuit diagram in which the SAW filters of FIGS. 15(b) and 16(b) are used as the transmitting and receiving filters T1 and R1, respectively. In both the cases, the matching circuit L is provided only for the receiving filter R1.

Here, the combination of the SAW filters in FIGS. 15(a) and (b) and 16(a) and (b) is not limited to the combinations of FIGS. 18 and 19. A combination of FIG. 15(a) with FIG. 16(b) and a combination of FIG. 15(b) with FIG. 16(a) may also be utilized.

Figure 15:
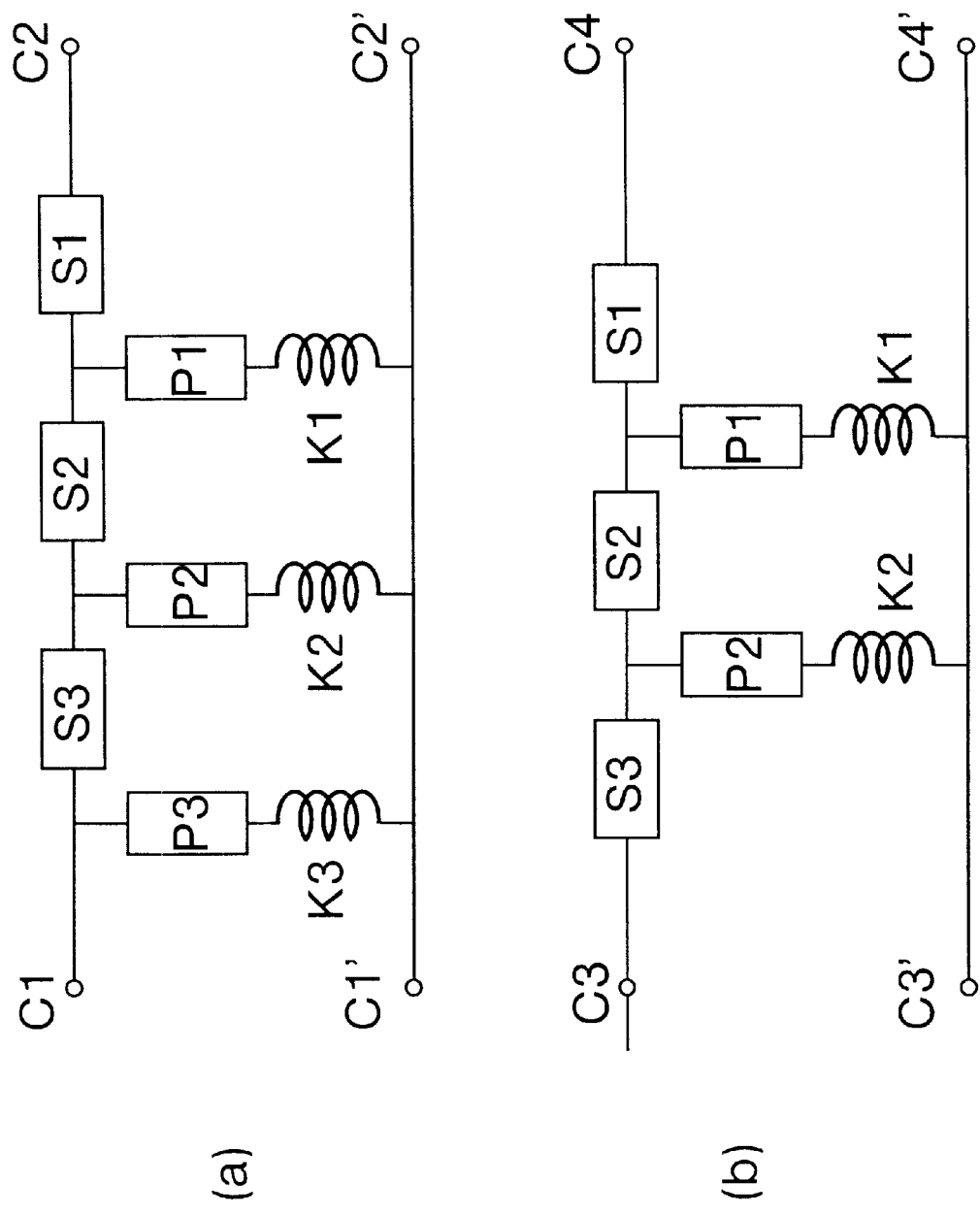
FIGS. 15(a) and 15(b) are diagrams illustrating examples of circuitry in SAW filters having lower pass band frequencies (transmitting filters T1 and T2)

The pass band and attenuation outside the pass band may be adjusted as desired by varying the number of connected so-called rungs of a ladder in the ladder-configured SAW filters shown in FIGS. 15(*a*), 15(*b*), 16(*a*) and 16(*b*) and the length of wires (i.e., inductance) between the filter chips and the duplexer package.

In general, the output/input impedance of a SAW filter having one-port SAW resonators connected in the ladder form can be adjusted by changing the number of electrode pairs and an aperture length of the one-port resonator which is a basic component unit of the filter. Further, the impedance characteristic of the filter is likely to reflect the impedance characteristic of a resonator connected closest to the terminal side of the ladder-configured circuit.

For this reason, from the viewpoint of the matching of the impedance, the impedance is controlled by use of at least one one-port resonator the closest to a receiving terminal side in the case of employing the construction where the receiving terminals Rx1 and Rx2 of the receiving filters R1 and R2 are commonized.

Figure 21:
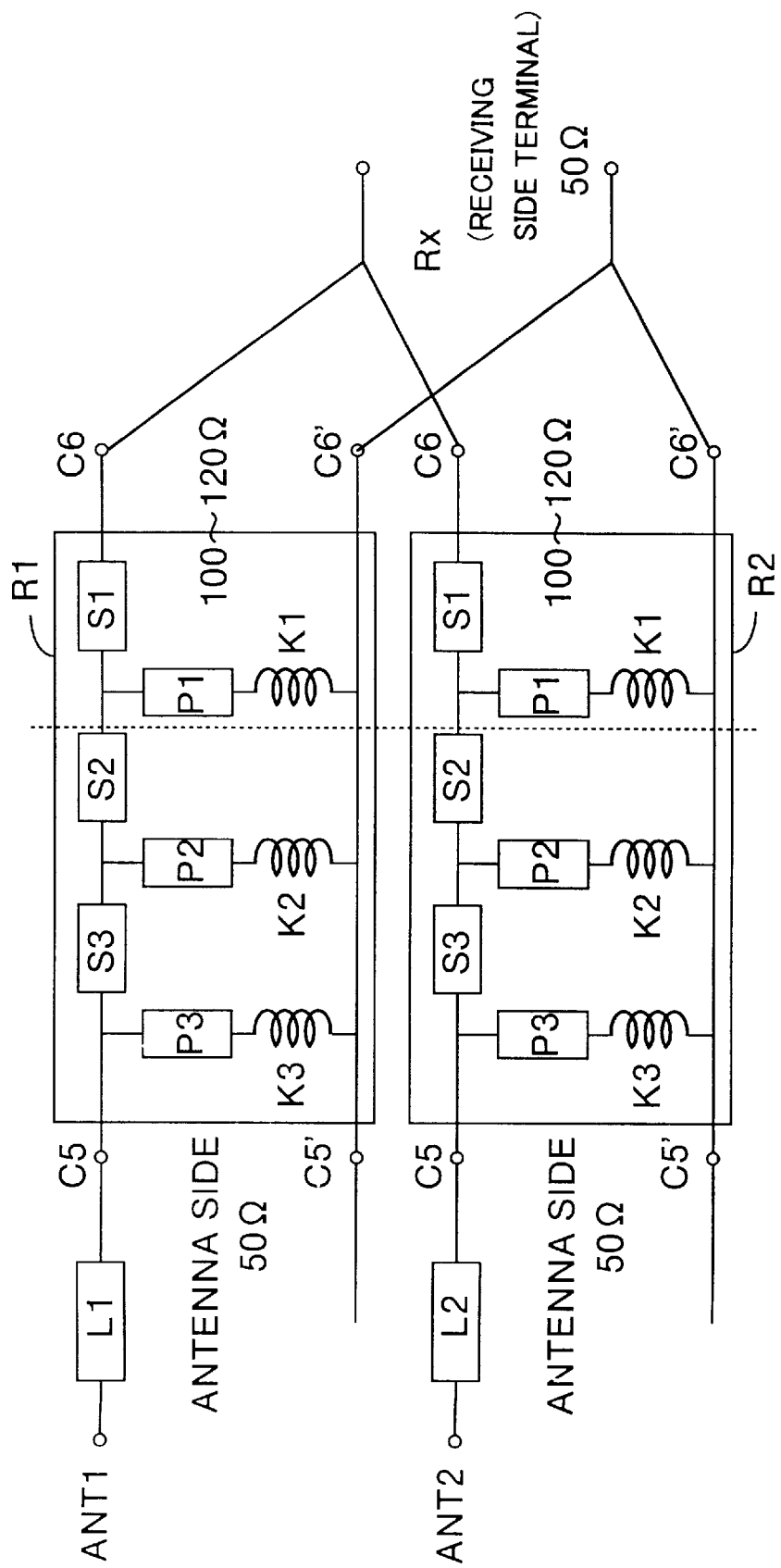
FIG. 21 is a diagram illustrating an example of circuitry of a duplexer in the case of making common receiving terminals of receiving filters (R1 and R2)
Figure 22:
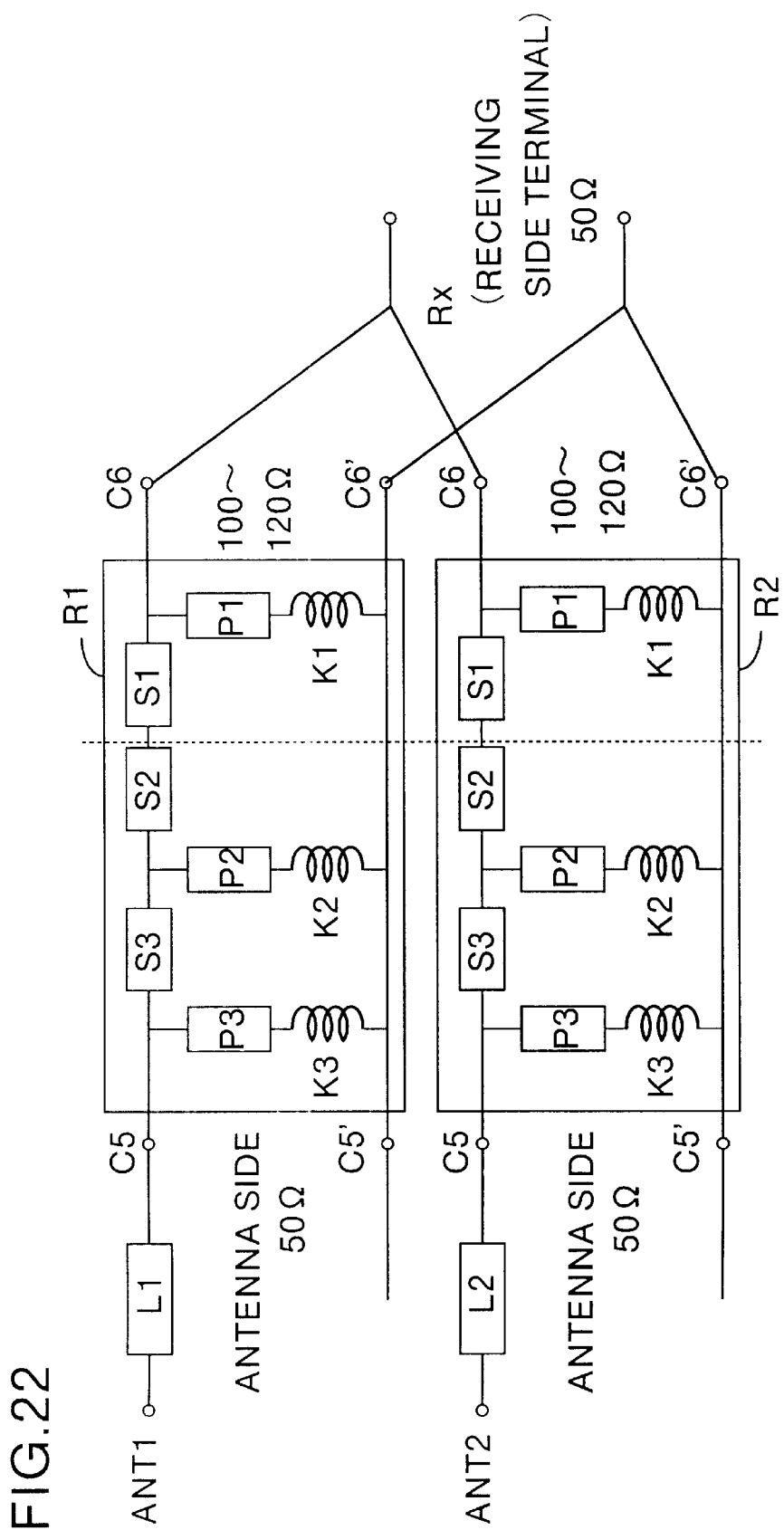
FIG. 22 is a diagram illustrating an example of circuitry of a duplexer in the case of making common receiving terminals of receiving filters (R1 and R2)

FIGS. 21 and 22 show examples of circuitry in-part of duplexers in which receiving terminals of the receiving filters R1 and R2 are made common.

If the receiving terminal Rx is thus shared by the receiving filters, the impedance as seen from the antenna terminals (ANT1 and ANT2) and the impedance of the receiving filters as seen from the receiving terminal may be controlled to about 50Ω by adjusting to 100 to 120Ω the input/output impedance as seen from the receiving terminal Rx of the resonators P1 and S1 on the first rung on the receiving terminal side of the receiving filters R1 and R2.

The circuitry shown in FIG. 21 or 22 itself can be utilized for the connection with the external terminals as shown in FIG. 14. That is, where one of the external RF switches on the receiving side is removed, a duplexer having the circuitry of FIG. 21 or 22 may be placed in the antenna duplexer mounting position 9.

Next, an example of the antenna duplexer of the present invention is described.

The antenna duplexer of the present invention is composed of a package of a multi-layered structure and filter chips 1 and 2 mounted within cavities inside the package, as shown in FIG. 4. The package is formed with use of a highly dielectric material (ε=9.5) such as glass ceramic, for example, which is formed in a number of layers (e.g., in five or six layers). In this multi-layered glass ceramic, a ground pattern and the matching layers L1 and L2 are inserted. Particularly, it is preferable for size reduction that the matching circuit layers L1 and L2 are formed as strip line patterns of about 100 to 150 μm width within layers above a filter chip mounting layer.

Metal grounds are provided in a ceiling portion at the topmost in the multi-layered structure and in an external terminal connection section at the bottom of the multi-layered structure. Grounding terminals are provided in layers (bonding pad portion) in which the connecting terminals are mounted, so as to prevent direct adjoining of the connecting terminals. The strip line patterns are formed in a position as vertically sandwiched between the metal ground in the ceiling portion and the inserted ground pattern or in a position as vertically sandwiched between the connecting terminals in the bonding pad portion and the metal ground in the external terminal connection portion.

The SAW filters of the filter chips 1 and 2 are formed with use of ladder-configured resonators in which one-port SAW resonators are connected in series arms and in parallel arms (see FIGS. 15(*a*), 15(*b*), FIG. 16(*a*) and FIG. 16(*b*)). The substrate thereof is made of LiTaO$_3$ of 42 Y rot-X propagation. Comb-form electrodes of the resonators are formed with use of an alloy primarily containing aluminum (e.g., Al—Cu, Al—Mg, etc.), which is formed in a multi-layered film (of Al—Cu/Cu/Al—Cu, Al/Cu/Al, Al/Mg/Al, Al—Mg/ Mg/Al—Mg, etc.) by sputtering, followed by exposing and etching processes into electrode patterns.

A material for wires for connection of the connecting terminals of the package and the input/output terminals on the filter chips may be Al—Si, for example.

The above-mentioned examples of materials for the package and the like are common to all the constructions shown in FIGS. 5(*a*), 5(*b*), 6, 8(*a*) to 8(*c*), 9(*a*) to 9(*c*) and 11(*a*) to 11(*c*).

Figure 23:
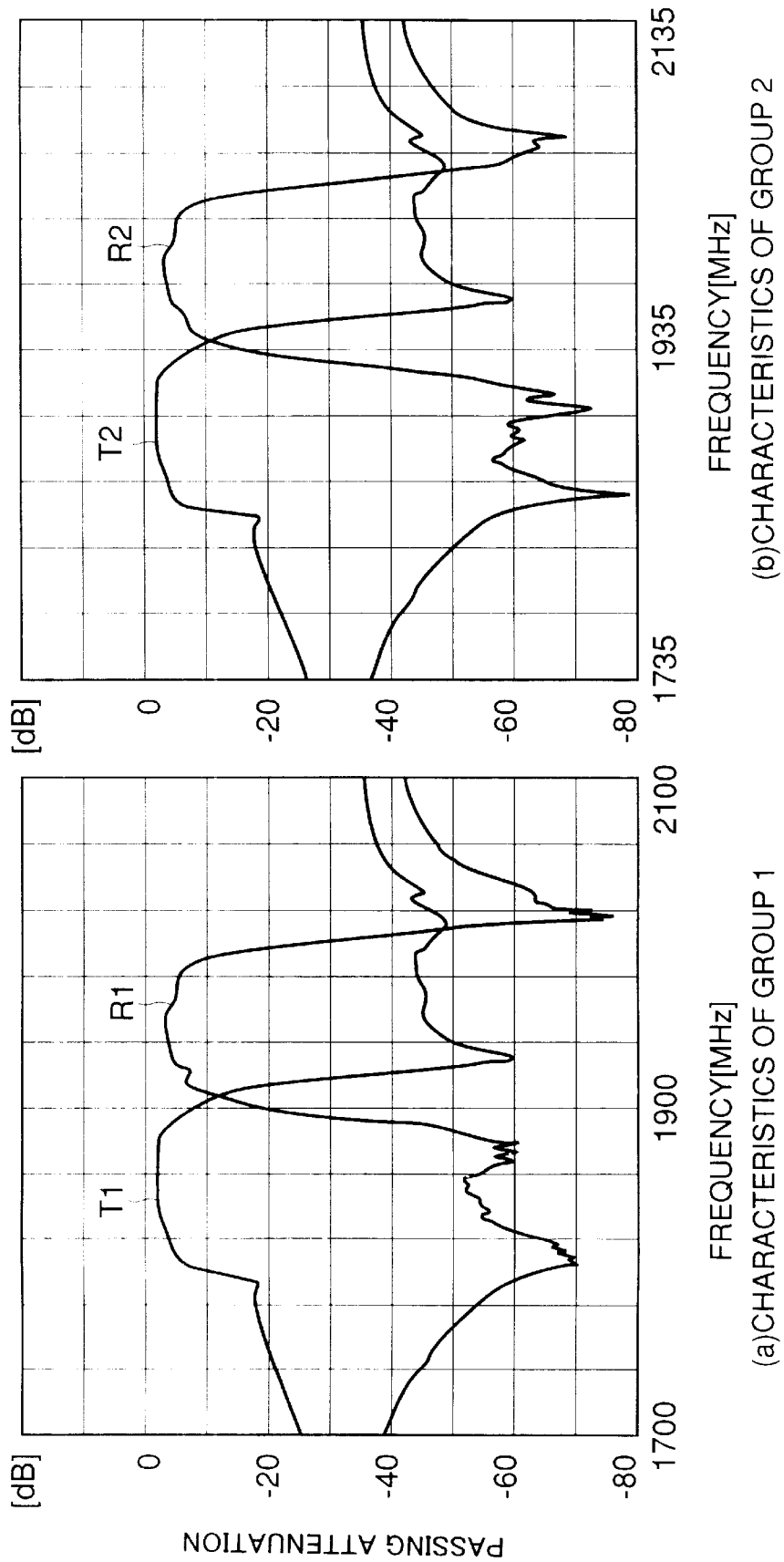
FIGS. 23(a) and 23(b) are graphical representations showing frequency characteristics of duplexers used in an antenna duplexer in accordance with the present invention.

Next, FIGS. 23(*a*) and 23(*b*) are graphical representations showing frequency characteristics of duplexers used in an antenna duplexer in accordance with the present invention.

These figures show the frequency characteristics of an antenna duplexer of 1.9 GHz band of the PCS system in which the center pass band frequencies of the two duplexers have a relatively small difference. The two filter chips are separated into a transmitting filter chip and a receiving filter chip and are connected as shown in FIGS. 8(*a*) to 8(*c*). However, connection may be that shown in FIGS. 9(*a*) to 9(*c*).

Here, the transmitting filter and the receiving filter of the duplexer are so designed that the pass band width is 30 MHz. The matching circuits are inserted between the receiving filter having a higher center pass band frequency and the antenna terminal. The matching circuit L1 has a pattern length of about 9.5 mm, and the matching circuit L2 has a pattern length of about 10.5 mm.

FIG. 23(*a*) shows the frequency characteristics of the duplexer of the group 1 (transmitting band: 1.85 GHz to 1.88 GHz, receiving band: 1.93 GHz to 1.96 GHz), and FIG. 23(*b*) shows the frequency characteristics of the duplexer of the group 2 (transmitting band: 1.88 GHz to 1.91 GHz, receiving band 1.96 GHz to 1.99 GHz).

According to the graphical representations of FIGS. 23(*a*) and 23(*b*), loss in the transmitting filters of the groups 1 and 2 is about 2.0 dB, and loss in the receiving filters of the groups 1 and 2 is about 4.0 dB. Stop band attenuation outside the pass bands is about 45 dB in both the transmitting filters of the groups 1 and 2 and about 53 dB in both the receiving filters of the groups 1 and 2. In the antenna duplexer shown in FIG. 23, the wires connecting the connecting terminals and the external circuits do not cross the patterns of the matching circuits. Therefore, the antenna duplexer obtains a sufficiently practical level of frequency characteristics as an antenna duplexer of the PCS system.

In the case where the antenna duplexer is mounted in a mobile phone, the antenna duplexer is preferably mounted on the printed circuit board 10 shown in FIG. 12 since the central pass band frequencies of the two duplexers generally have a relatively small difference. That is, by providing the antenna duplexer with RF switches, it is possible to reduce the size of the antenna duplexer further.

In the case of employing a ladder-configured filter construction of 1.9 GHz band, the normalized thickness of comb-form electrodes of the SAW filters may be about 9%, and the period of the electrodes may be about 1.95 μm to about 2.18 μm. The terminals of the package may be arranged as in FIG. 6 and may be connected as in FIG. 11. In this case, the matching circuits L1 and L2 may have substantially the same pattern length (about 9.5 mm).

Figure 24:
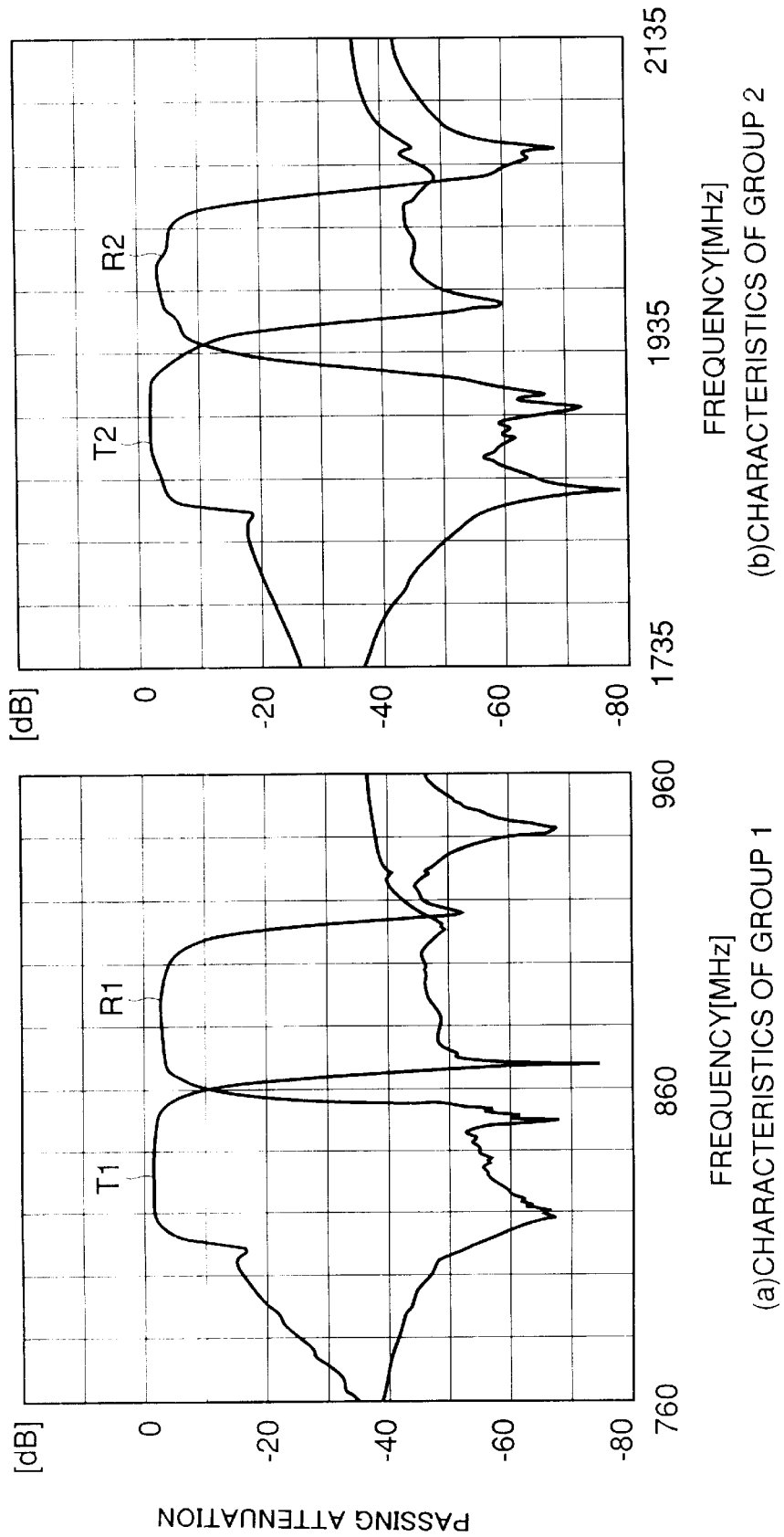
FIGS. 24(a) and 24(b) are graphical representations showing frequency characteristics in the case where an antenna duplexer including a duplexer of 800 MHz band and a duplexer of 1.9 GHz band is mounted in a package shown in FIG. 6.

Next, FIGS. 24(a) and 24(b) are graphical representations showing frequency characteristics in the case where an antenna duplexer including a duplexer of 800 MHz band and a duplexer of 1.9 GHz band is mounted in the package shown in FIG. 6. The package is connected as shown in FIG. 11. This corresponds to an antenna duplexer having two duplexers whose center pass frequencies differ from each other by 20% or more.

Here, the transmitting and receiving filters belonging to the group 1 are mounted on one filter chip, and the transmitting and receiving filters belonging to the group 2 are mounted on another filter chip. The matching circuits L1 and L2 have lengths of about 24 mm (for 800 MHz band) and about 9.5 mm (for 1.9 GHz band), respectively.

According to FIGS. 24(a) and 24(b), the antenna duplexer is also obtained in this case, which has substantially the same loss and stop band attenuation as the antenna duplexer shown in FIGS. 23(a) and 23(b).

When this antenna duplexer is mounted on a mobile phone, the printed circuit board 10 shown in FIG. 7 is preferably used since the center pass band frequencies of the two duplexers are significantly different.

In the case of a ladder-configured filter of 800 MHz, the normalized thickness of comb-form electrodes of the SAW filters may be about 9%, and the period of the electrodes may be about 4.3 μm to about 4.8 μm. In the case of a ladder-configured filter of 1.9 GHz, the aforesaid conditions can also be used.

If the receiving terminal Rx is shared by the receiving filters as shown in FIGS. 21 and 22, the one-port SAW resonators may be designed, for example, under the following conditions for a 1.9 GHz band PCS filter for matching impedance:

Resonator $S_1$ on the series arm: aperture length of about 30 μm, 55 to 65 pairs of electrodes;

Resonator $P_1$ on a parallel arm: aperture length of about 40 μm, 30 to 35 pairs of electrodes;

Other resonators on the series arm: aperture length of about 30 μm, 129 pairs of electrodes; and Other resonators on parallel arms: aperture length of about 40 μm, 65 pairs of electrodes.

According to the present invention, the size reduction and easy production of an antenna duplexer having two duplexers accommodated in a single package is realized while maintaining sufficient frequency characteristics.

Further, it is also possible to reduce the size of mobile phones other communication devices into which the antenna duplexers of the invention are integrated and to facilitate the production of high frequency parts thereof.

What is claimed is:

1. An antenna duplexer comprising:
   two duplexer elements each including two surface acoustic wave filters having different center pass band frequencies; and
   connecting terminals for connecting the duplexer elements and external circuits, which are grouped into an antenna terminal group for connection to an external antenna, a receiving terminal group for connection to an external circuit and a transmitting terminal group for connection to an external circuit, each of said terminal groups containing a plurality of terminals,
   wherein regions for disposing the antenna terminal group, the receiving terminal group and the transmitting terminal group are separated planarly.

2. An antenna duplexer according to claim 1, wherein the two duplexer elements are accommodated in a common package and the terminal groups are disposed in a peripheral region of the package.

3. An antenna duplexer according to claim 2, further comprising a matching circuit formed in the package which has a multi-layered structure.

4. An antenna duplexer according to claim 3, wherein the multi-layered package is provided with two cavities in which the duplexer elements are mounted.

5. An antenna duplexer according to claim 2, wherein the duplexer elements comprise a first duplexer element including two transmitting surface acoustic wave filters and a second duplexer element including two receiving surface acoustic wave filters, the transmitting terminal group is disposed near the first duplexer element, the receiving terminal group is disposed near the second duplexer element, and grounding terminals are disposed between the terminals of the terminal groups.

6. An antenna duplexer according to claim 5, wherein a first duplexer is comprised of a first transmitting surface acoustic wave filter of the first duplexer element and a first receiving surface acoustic wave filter of the second duplexer element, a second duplexer is comprised of a second transmitting surface acoustic wave filter of the first duplexer element and a second receiving surface acoustic wave filter of the second duplexer element, and the first and second transmitting and receiving surface acoustic wave filters are so disposed that a line connecting the first transmitting surface acoustic wave filter and the first receiving surface acoustic filter crosses a line connecting the second transmitting surface acoustic wave filter and the second receiving surface acoustic filter.

7. An antenna duplexer according to claim 6, further comprising a first relay terminal and a second relay terminal for connection of the first and second receiving surface acoustic wave filters, respectively; and a first matching circuit and a second matching circuit formed in patterned strip lines between the antenna terminal group and the first and second relay terminals, respectively, wherein the patterned strip lines of the first and second matching circuits and the connecting terminals are so arranged that, if the patterned strip line of the first matching circuit spatially crosses a wire connecting an external circuit and the transmitting or receiving terminal group which is connected to the first duplexer or if the patterned strip line of the second matching circuit spatially crosses a wire connecting an external circuit and the transmitting or receiving terminal group which is connected to the second duplexer, coupling capacities formed between the terminal groups and the first or second matching circuit whose patterned strip line spatially crosses the connecting wire are 0.075 pF or less.

8. An antenna duplexer according to claim 6, further comprising a first relay terminal and a second relay terminal for connection of the first and second receiving surface acoustic wave filters, respectively; and a first matching circuit and a second matching circuit formed in patterned strip lines between the antenna terminal group and the first and second relay terminals, respectively, wherein the first matching circuit is disposed so as to not spatially cross wires connecting external circuits and the transmitting and receiving terminal groups which are connected to the first duplexer, and the second matching circuit is so disposed not to spatially cross wires connecting external circuits and the transmitting and receiving terminal groups which are connected to the second duplexer.

9. An antenna duplexer according to claim 2, wherein the duplexer elements comprise a first duplexer element including a first transmitting surface acoustic wave filter and a first receiving surface acoustic wave filter and a second duplexer element including a second transmitting surface acoustic wave filter and a second receiving surface acoustic wave filter, the first and second transmitting surface acoustic wave filters are disposed near the transmitting terminal group, and the first and second receiving surface acoustic wave filters are disposed near the receiving terminal group.

10. An antenna duplexer according to any one of claims 1 to 7, wherein at least one of the surface acoustic wave filters is composed of a ladder-configured band-pass filter in which one-port SAW resonators are connected in parallel and series arms.

11. An antenna duplexer according to claim 8, wherein, if, in the receiving terminal group, terminals connected to the first and second receiving surface acoustic wave filters are formed as a common terminal and, in the transmitting terminal group, terminals connected to the first and second transmitting surface acoustic wave filters are separate terminals, an impedance on a receiving side as seen from the common terminal is different from an input/output impedance of the first and second receiving surface acoustic wave filter, and the impedance on the receiving side as seen from the common terminal is substantially the same as an impedance on the receiving side as seen from the antenna terminal group.

* * * * *